(12) United States Patent
Brenner et al.

(10) Patent No.: US 7,176,066 B2
(45) Date of Patent: Feb. 13, 2007

(54) FABRICATION OF NANOELECTRONIC CIRCUITS

(75) Inventors: Rolf Brenner, Randwick (AU); Tilo Marcus Buehler, Randwick (AU); Robert Graham Clark, Balgowah Heights (AU); Andrew Steven Dzurak, Potts Point (AU); Alexander Rudolf Hamilton, Coogee (AU); Nancy Ellen Lumpkin, Waterfall (AU); Rita Paytricia McKinnon, Dulwich Hill (AU)

(73) Assignee: Unisearch Limited, Sydney (AU)

( * ) Notice: Subject to any disclaimer, the term of this patent is extended or adjusted under 35 U.S.C. 154(b) by 0 days.

(21) Appl. No.: 11/132,851

(22) Filed: May 19, 2005

(65) Prior Publication Data
US 2005/0214689 A1    Sep. 29, 2005

Related U.S. Application Data

(63) Continuation of application No. 10/362,822, filed as application No. PCT/AU01/01056 on Aug. 27, 2003, now abandoned.

(30) Foreign Application Priority Data
Aug. 31, 2000 (AU) .................................. PQ9807

(51) Int. Cl.
*H01L 21/20* (2006.01)
*H01L 21/335* (2006.01)
*H01L 21/425* (2006.01)

(52) U.S. Cl. .................. 438/142; 438/622; 438/637; 438/800; 438/525; 257/E21.404

(58) Field of Classification Search ............... 438/584, 438/587, 622, 637, 2, 20, 510, 525, 142; 257/E21.404
See application file for complete search history.

(56) References Cited

U.S. PATENT DOCUMENTS

| 4,767,721 | A | 8/1988 | Liao et al. | |
| 6,150,256 | A | 11/2000 | Furukawa et al. | |
| 6,358,843 | B1 * | 3/2002 | Babcock et al. | 438/637 |
| 6,582,890 | B2 * | 6/2003 | Dentinger et al. | 430/322 |
| 6,653,054 | B2 * | 11/2003 | Schiltz | 430/312 |

FOREIGN PATENT DOCUMENTS

| GB | 23460009 | 7/2000 |
| JP | 2001-204978/21 | 11/2000 |

OTHER PUBLICATIONS

R. Vrijen et al., "Electron Spin Resonance Transistors for Quantum Computing in Silicon-Germanium Heterostructures", Physical Review A, vol. 13, Article 012306, American Physical Society, New York, Jun. 13, 2000.

* cited by examiner

*Primary Examiner*—Savitri Mulpuri
(74) *Attorney, Agent, or Firm*—Wood, Phillips, Katz, Clark & Mortimer

(57) ABSTRACT

A silicon substrate is coated with one or more layers of resist. First and second circuit patterns are exposed in sequence, where the second pattern crosses the first pattern. The patterned resist layers are developed to open holes which extend down to the substrate only where the patterns cross over each other. These holes provide a mask suitable for implanting single phosphorous ions in the substrate, for a solid state quantum computer. Further development of the resist layers provides a mask for the deposition of nanoelectronic circuits, such as single electron transistors, aligned to the phosphorous ions.

23 Claims, 29 Drawing Sheets

DEFINITION OF LOCUS
FOR ION IMPLANTS (PATTERN A)
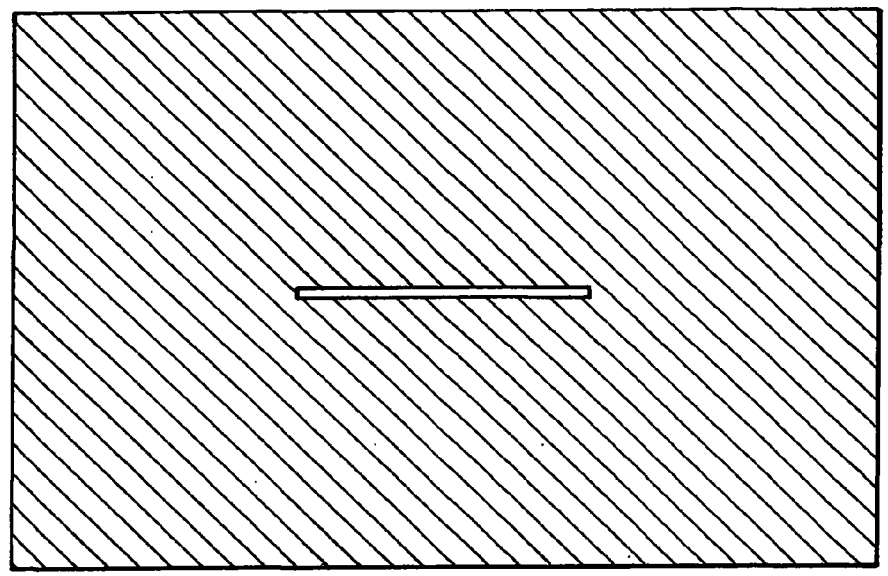
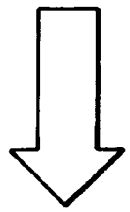
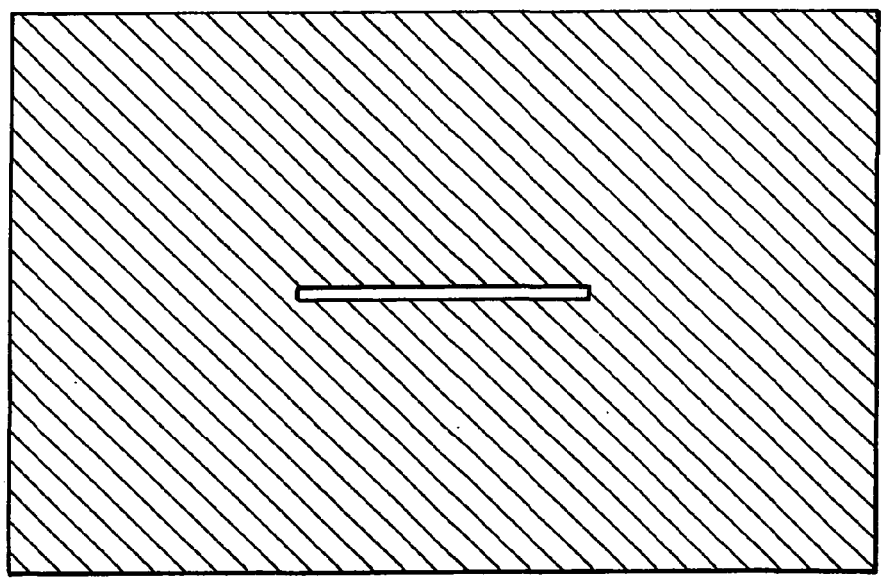
FIG. 7(a)

IMPLANTATION

*COMPUTER DEVICE AFTER METAL LIFT-OFF AND CLEAN*

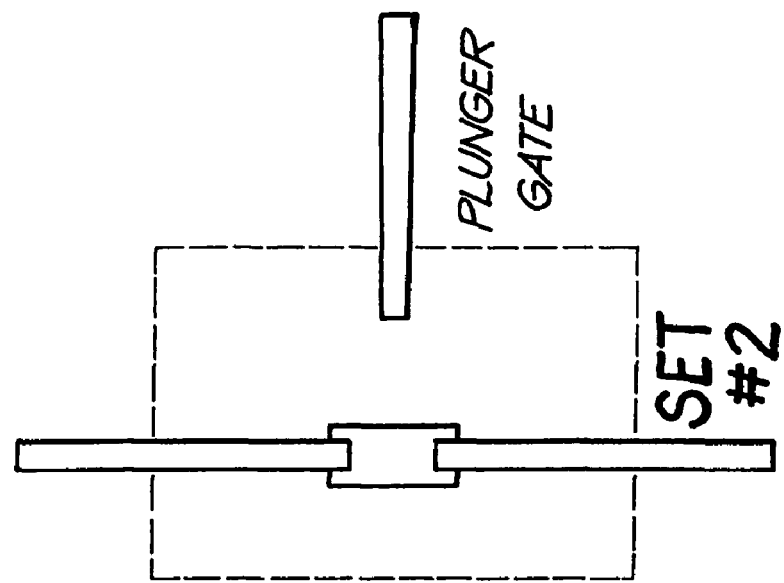
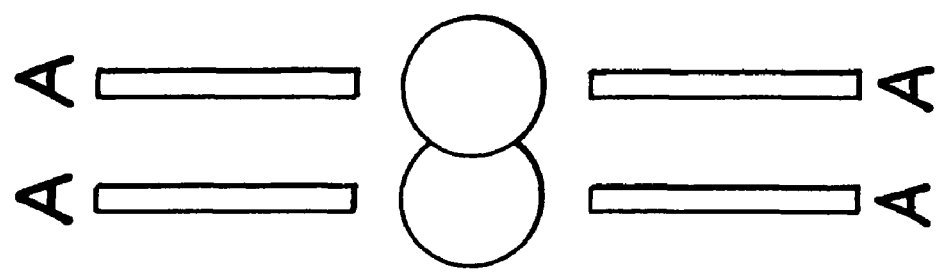
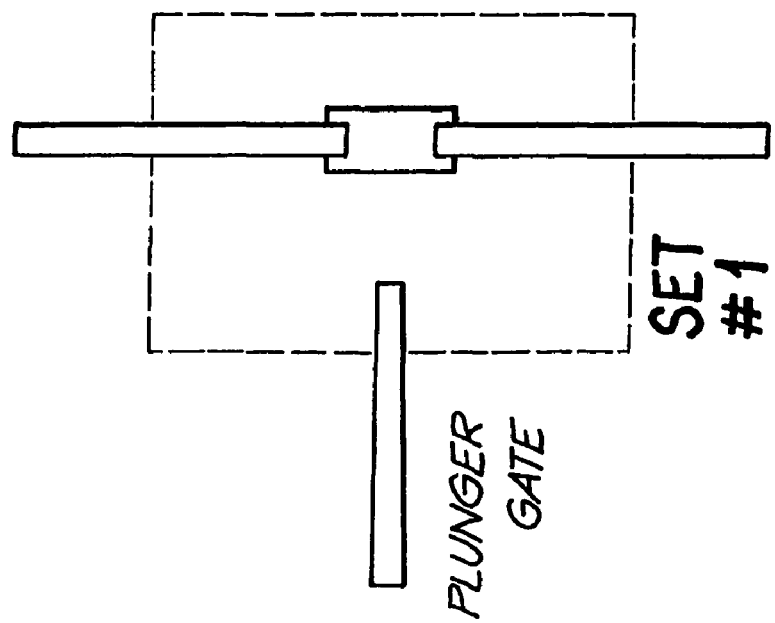
FIG. 20

FABRICATION OF NANOELECTRONIC CIRCUITS

CROSS-REFERENCE TO RELATED APPLICATION

This application is a continuation of prior application Ser. No. 10/362,822, which has a 371(c) date of Aug. 27, 2003 now abandoned, and which is the United States National Stage of International Application No. PCT/AU01/01056, which was filed on Aug. 24, 2001.

TECHNICAL FIELD

This invention concerns the fabrication of nanoelectronic circuits, and in particular methods of fabrication of nanoelectronic circuits suitable for solid state quantum computer control and read-out. In a further aspect it concerns circuits made using the method.

BACKGROUND ART

One proposed architecture for fabricating a solid state quantum computer (SSQC), involves an array of phosphorous-31 ($^{31}P$) atoms embedded in a silicon matrix to provide the quantum bits (qubits). In this design[1,2] the qubit information is encoded on the nuclear spin of the phosphorous atoms, which have a very long spin relaxation time at low temperatures. Interactions between qubits is mediated via the donor electrons associated with the phosphorous atoms, which can be conveniently controlled using gate electrodes. Alternatively the qubit information can simply be encoded on the electron spin[3], although in this case the quantum computation is more susceptible to decoherence errors, as the electron spin relaxation time is much shorter that the nuclear spin relaxation time.

Qubit read-out in both nuclear spin[1,2] and electron spin[3] SSQC designs requires an ability to determine the spin state of a single electron. A method proposed by Kane[1,4] uses a single electron transistor (SET) device near a pair of phosphorous atoms to determine the spin state of the resulting two-electron system, using the phenomenon of Pauli exclusion. Therefore a critical requirement of the nanoelectronic circuitry for the SSQC is the integration of conducting control gates (used to manipulate the nuclear or electronic spin of the qubit) in close proximity to SET devices (used to detect single charge displacement and so perform qubit read-out)[1]. SET devices can be conveniently fabricated from aluminium/aluminium oxide ($Al/Al_2O_3$) structures using a double-angle metal evaporation technique[5,6]. The control gates and SETs must also be aligned (or registered) to the underlying $^{31}P$ donors, which constitute the qubits in the SSQC.

The sensitivity of SETs to charge motion between two locations can be increased by using two SETs, on either side of the region of interest, and correlating the output of the two devices. This approach was first applied in the study of Quantum Cellular Automata by Amlani et al.[7] in 1997.

SUMMARY OF THE INVENTION

The invention is a method for fabricating nanoelectronic circuits, including the steps of:

Coating a semiconductor substrate with one or more layers of resist;

Exposing (writing) a circuit pattern into the layer(s) of resist, followed by development of this pattern, if required;

Coating this substrate with one or more additional layers of resist, if required;

Exposing (writing) a second circuit pattern into the resist layers, such that this pattern crosses the previously exposed pattern;

Developing the patterned resist layers to open holes through them which extend down to the semiconductor substrate surface only where the patterns cross over each other;

Implanting an ion through each hole;

Further developing the patterned resist layers to open further areas of the semiconductor substrate surface around the holes;

Evaporating metal at different angles through remaining resist layers to create active devices and conducting control gates on the semiconductor substrate surface positioned relative to the implanted ions as determined by the angle of evaporation.

One circuit pattern may define the geometry of the active devices and conducting and control gates, and the other circuit pattern may define the locus on which the holes are to be opened for the ion implantation. Both circuit patterns can be written with the same resolution and accuracy as each other but it may not be possible to register the patterns to one another with such accuracy. In this case the circuit patterns themselves may be designed to ameliorate the disadvantages of this inaccuracy. In particular the pattern for the active devices and conducting gates may be a series of parallel straight lines and the other pattern may be a straight line transverse to the straight lines of the other pattern. In this case the other pattern will ensure the ions are implanted in a straight line across the active devices and conducting gates, even if the line is not placed in precisely the correct location.

A method of fabricating nanoelectronic circuits suitable for solid state quantum computer control and read-out utilises a three (or more)-layer resist with one or more ions implanted through each hole, and double (or triple)-angle metal deposition to create the active devices, such as SETs, and the control gates, such as the 'A' and 'J' gates[1] registered with sufficient accuracy above the implanted ions. It will be appreciated that only one ion is implanted through each hole in the nuclear spin and electron spin quantum computers currently proposed.

One example of such a process comprises the steps of:

Coating a semiconductor substrate with a first resist (resist 1);

Writing a first pattern (pattern A) for the locus of ion positions into resist 1;

Developing the first pattern (pattern A);

Coating with a second resist (resist 2); and then with a third resist (resist 3) of lower sensitivity than resist 2, where both resist 2 and resist 3 use a different developer solution (or process) to resist 1;

Writing a second pattern (pattern B) for the metal circuitry into the resist layers such that the second pattern crosses over the first pattern;

Partially developing the second pattern (pattern B), such that trenches are opened in resists 2 and 3 only where pattern B is defined, and such that holes down to the silicon substrate are opened only where patterns A and B cross each other;

Implanting single ions through each hole;

Fully developing pattern B, to create a cavity region under resist 3;

Removing the remainder of resist 1 which lies within the cavity;

Evaporating metal at a first angle through the resist layers;

Oxidising the surface of the first metal layer;

Evaporating metal at a second angle through the resist layers;

Evaporating metal at a third angle through the resist layers;

Lifting-off all resist layers in solvents to reveal completed device and passivating or glassivating the surface as required;

Annealing the sample to activate the dopants and remove ion-beam damage.

In the case of electron beam lithography (EBL) alignment is limited by the ability to focus on registration features at the low beam currents needed for high-resolution pattern exposure. Consequently, it is difficult to achieve alignment better than 50 nm, which would not be sufficient for SSQC devices. The key advantage of the double exposure process described here is that ultra-high accuracy alignment is not required. The crossed exposure patterns create a mask for subsequent ion implantation which is perfectly aligned to the control gates in one direction. Alignment in the direction perpendicular to this is far less critical. In addition, the donor ions which constitute the qubits in the SSQC are all precisely aligned to each other.

The key advantage of simultaneous deposition of the SET electrodes and the control gates is that only one high-resolution lithography exposure is needed to define all metal circuitry. If the SET electrodes and the control gates were deposited in two different process steps (which would be the case if different materials were used for each) it would be necessary to align the two circuit patterns to each other with a degree of accuracy better than the SET-to-control gate separation. The technique described here provides perfect self-alignment of metal features, in that all metal features can be defined in one pattern exposure.

Using this method, SET electrodes (source, drain, island and plunger) can be made from the same material (for example, evaporated Al), as qubit control gates, allowing both types of conducting features to be deposited in a simultaneous process step.

Electron beam lithography (EBL), X-Ray lithography, scanning probe lithography or some other high-resolution lithography process may be used to write the patterns. The most convenient and well-developed of these is EBL.

Al conducting regions can be produced by either thermal evaporation or electron-beam evaporation.

A controlled dose of molecular oxygen may be supplied between depositions to form a controllably thin insulating layer, necessary to produce SET read-out devices, as first described by Fulton and Dolan[6] in 1987.

Unlike more conventional fabrication strategies, this approach requires only one EBL exposure to define all metal gates and interconnects, and also allows in-situ oxidation of the Al to form controllable tunnel junctions.

Resist 2, being more sensitive to electron-beam exposure than resist 3 above it, is used to create resist profiles with overhangs. The overhanging resist acts as a shadowing element for the evaporations[5,6].

The evaporations are done from different angles, so that a junction is formed at the overlap. The size of this overlap determines the tunnel junction capacitance and tunnel resistance, and can be varied by changing the deposition angle[6].

The process may be used to make the metallisation circuitry registered to $^{31}P$ donors for a complete multi-qubit device. A similar process, using only one EBL exposure and a bilayer resist with double-angle evaporation, can also be used to make the metallisation circuitry for a twin-SET SSQC read-out simulation device.

BRIEF DESCRIPTION OF THE DRAWINGS

Examples of the invention will now be described with reference to the accompanying drawings, in which.

a. Definition of locus for ion implants (pattern A)

b. Exposure of SET and gates EBL pattern B on bilayer resist to form cross pattern c. Implantation d. SET and gate pattern development e. First metal evaporation f. Second metal evaporation—SET and J-gates formation g. Third metal evaporation—A-gates and plunger formation h. Computer device after metal lift-off and clean.

Figure 8:
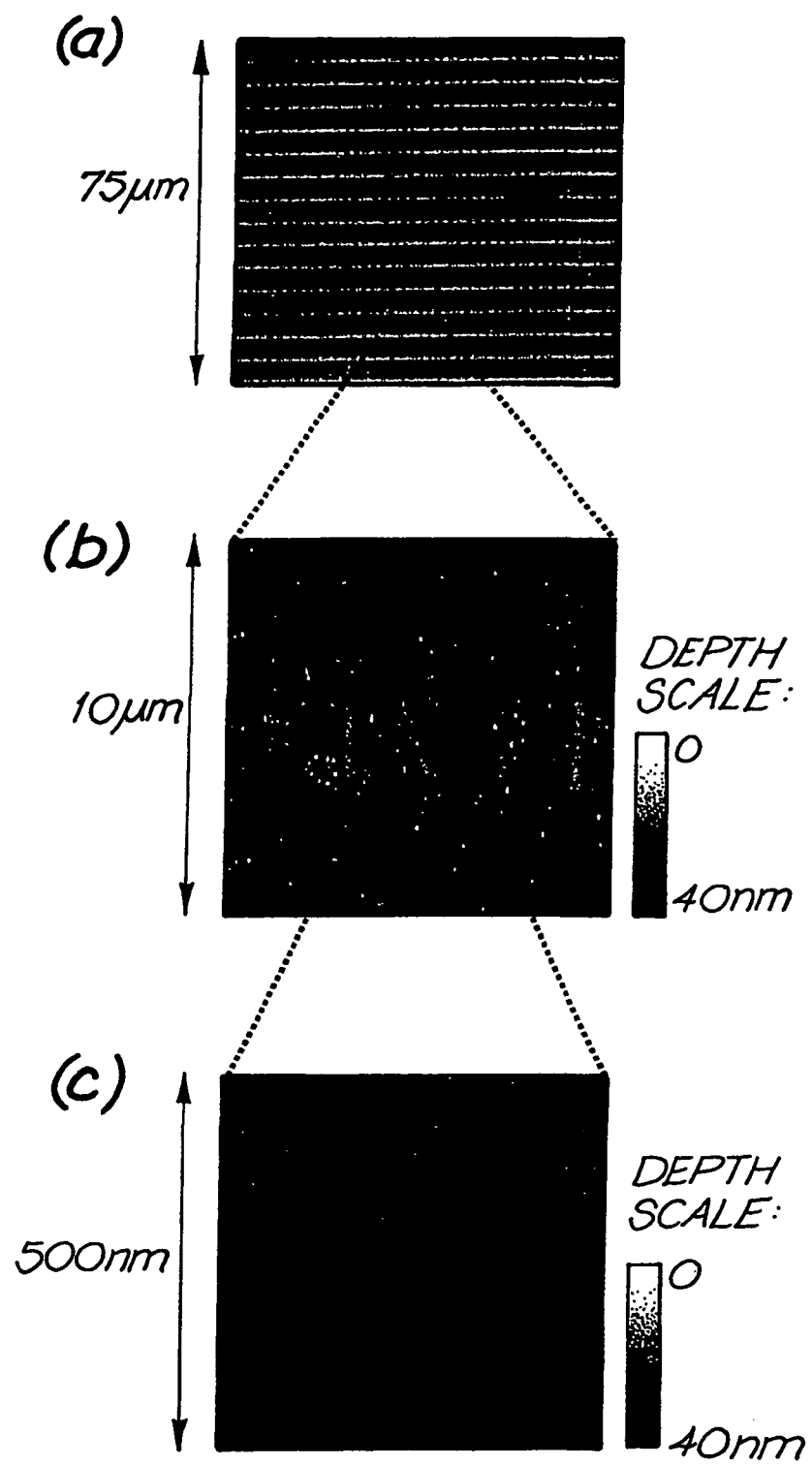

FIG. 8 is (a) a schematic showing an experimental demonstration of cross patterns exposed and developed in a trilayer resist and (b) and (c) AFM images of substrate after etching and removal of resist.

Figure 9:
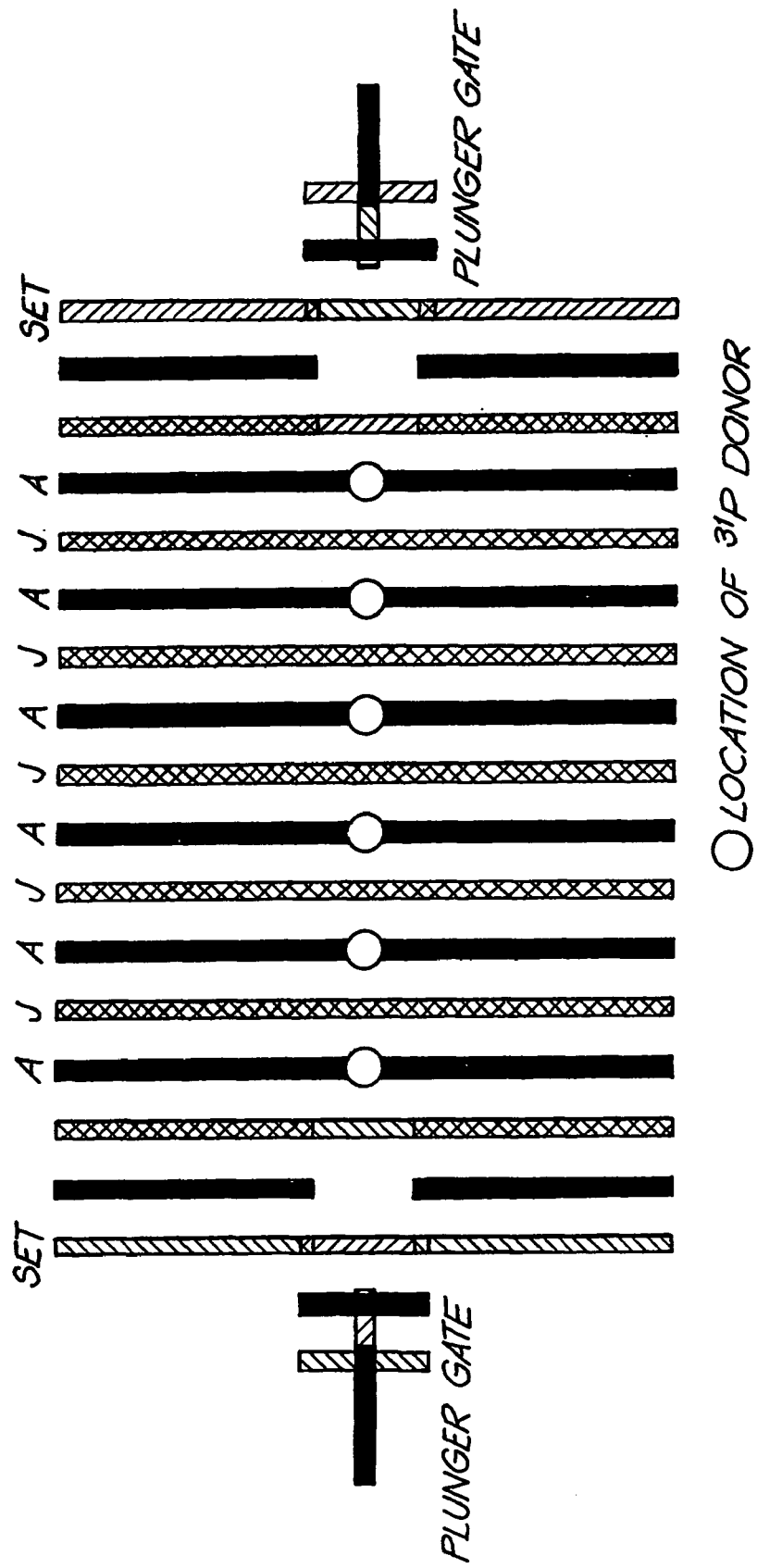

FIG. 9 is a schematic showing a complete 6-donor SSQC device, with SET read-out at either end, capable of production using the technique.

Figure 10:
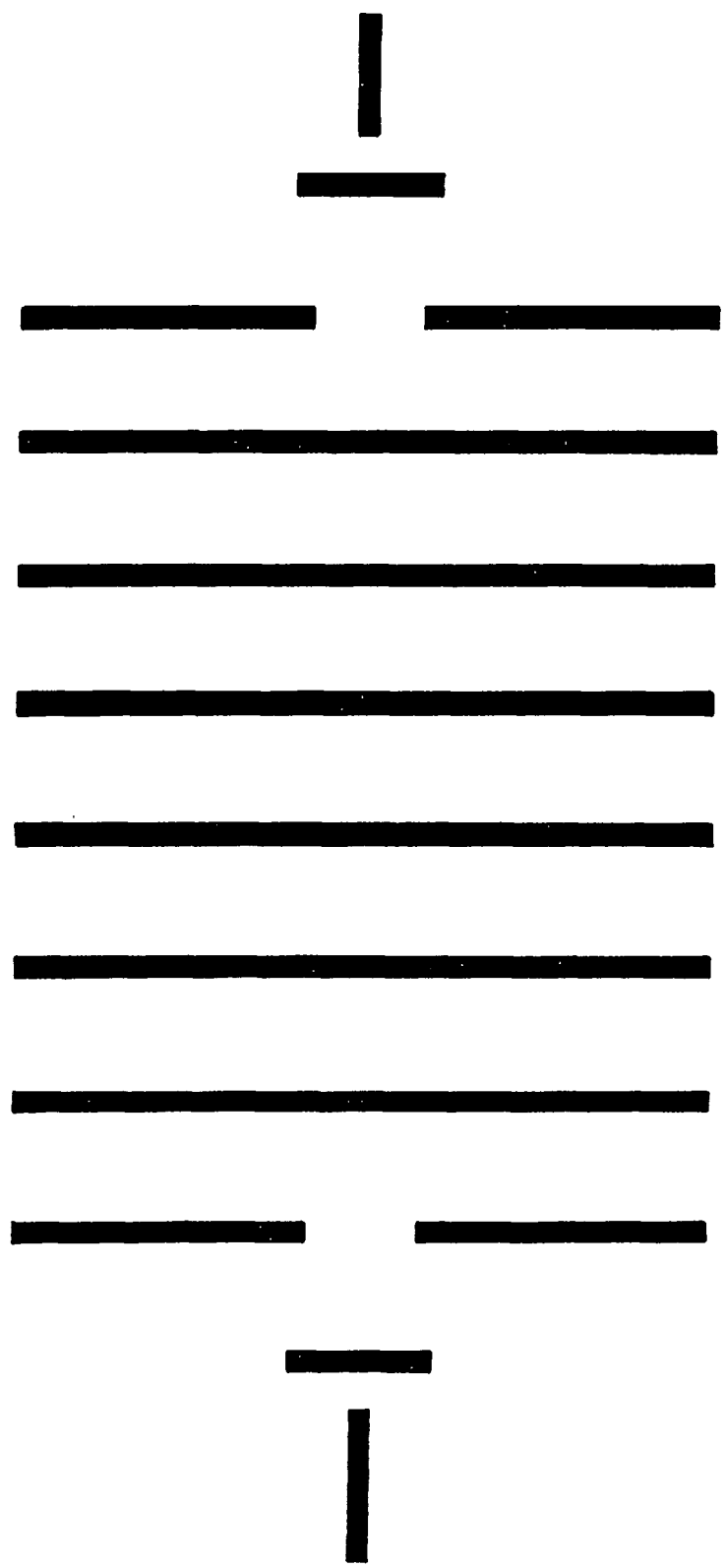

FIG. 10 is an EBL exposure pattern used in the technique to fabricate a 6-donor SSQC device.

Figure 11:
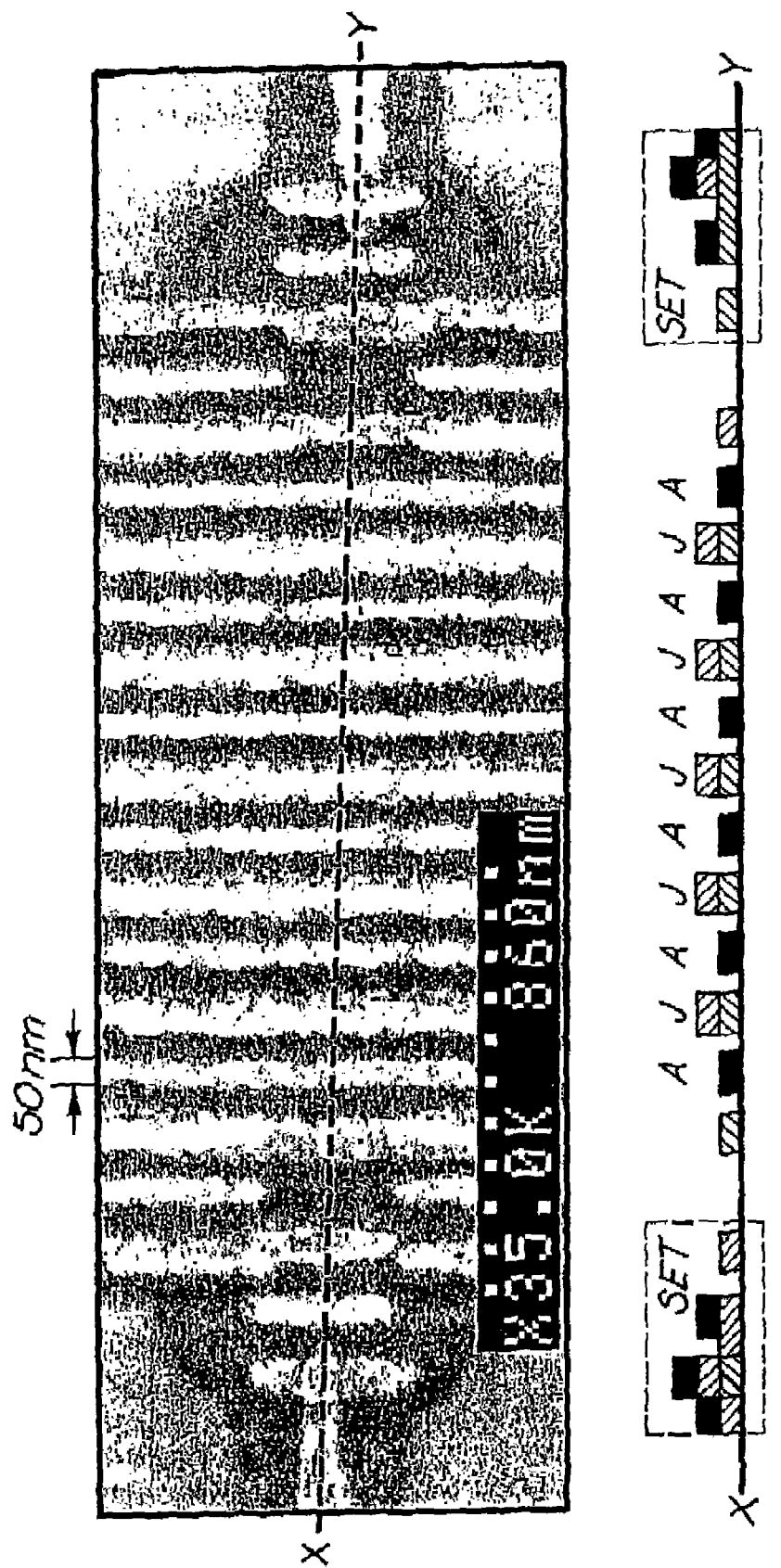

FIG. 11 is an SEM micrograph of the gate array and SETs for a 6-donor SSQC device, fabricated using the technique, and the schematic below depicts a cross-section through the line marked XY.

Figure 12:
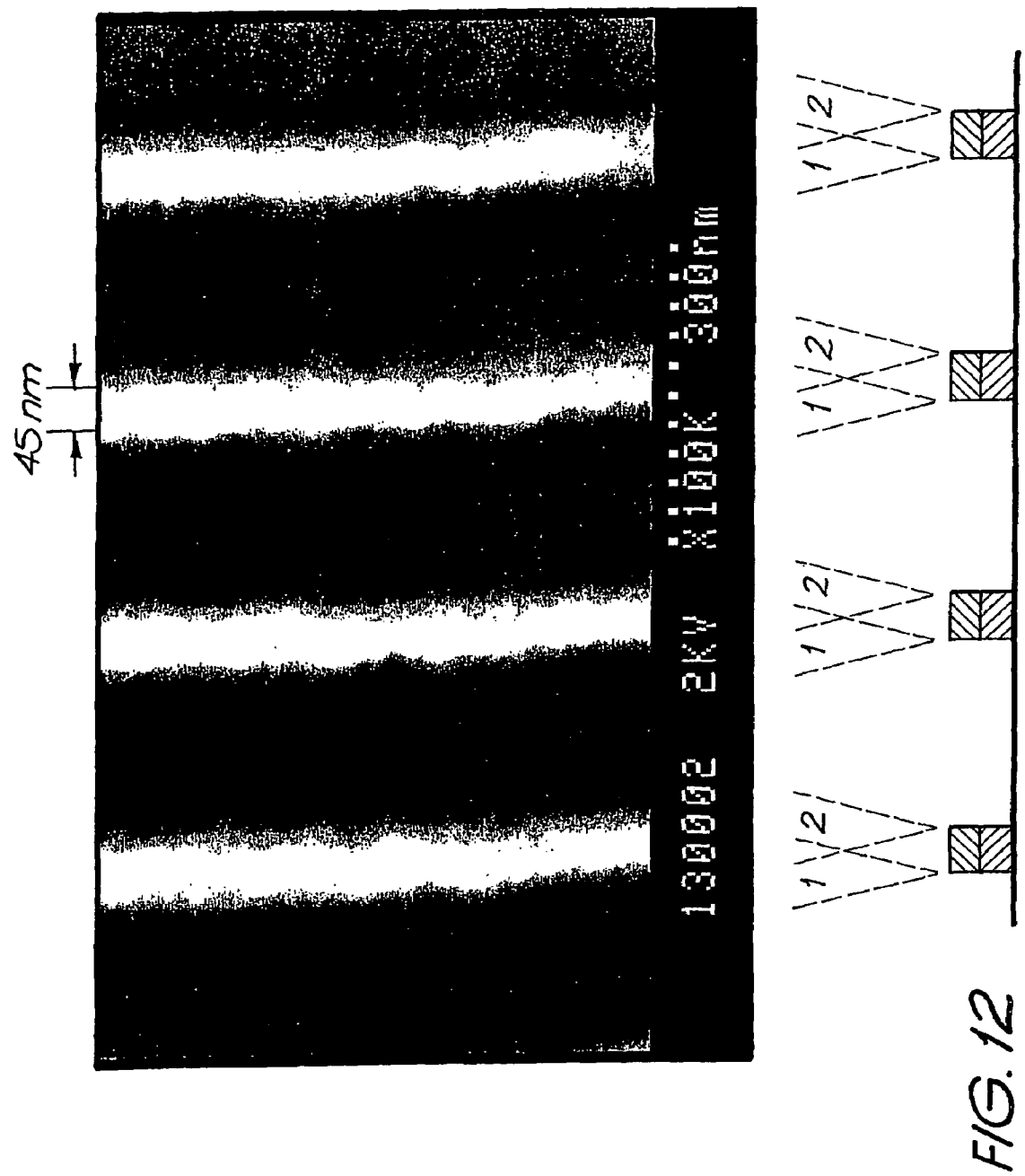

FIG. 12 is an SEM micrograph showing a test pattern in which metal depositions from two different angles have been accurately aligned to coincide spatially, leading to a double metal thickness, but a linewidth of only 45 nm.

FIG. 13 is (a) an EBL exposure pattern used to fabricate a 2-donor device, (b) a schematic showing the gate array and SETs resulting from triple-angle shadow evaporation, and (c) and (d) SEM micrographs of demonstration metallisations using the pattern shown in (a).

Figure 14:
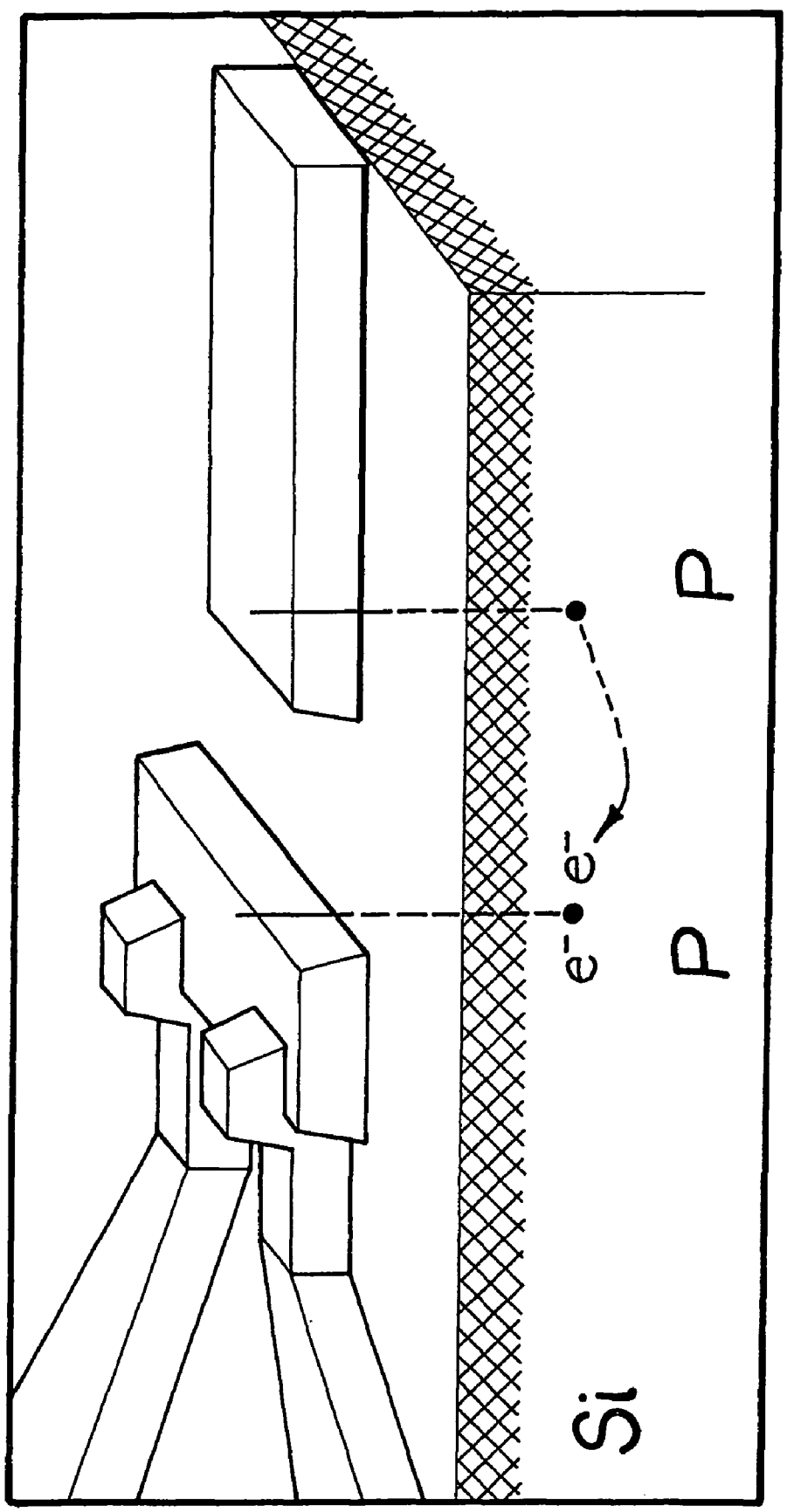

FIG. 14 is a schematic diagram of an SET device used for spin readout, as proposed by Kane[1].

Figure 15:
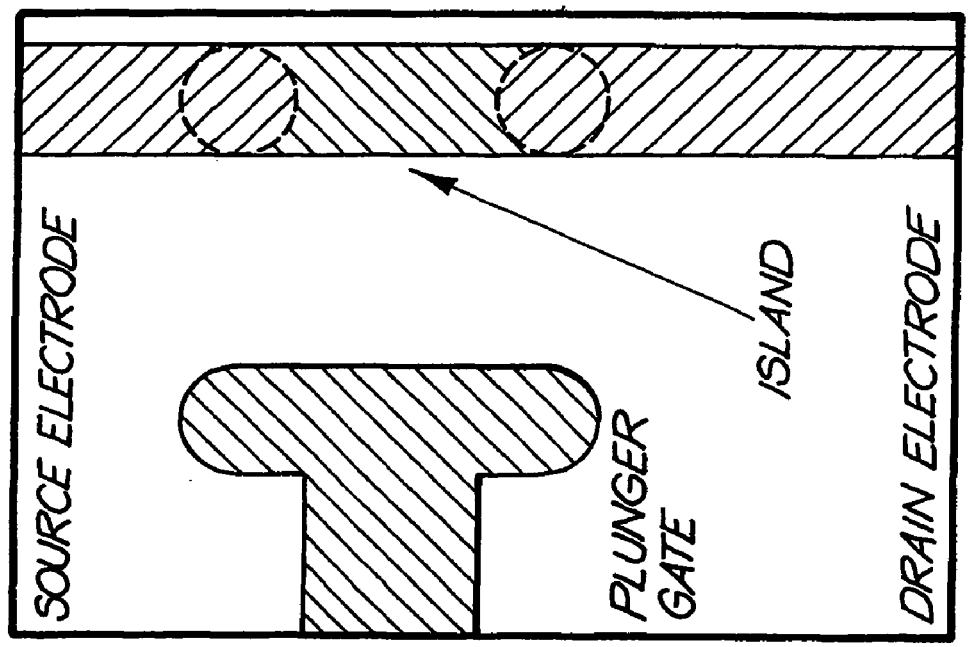

FIG. 15 is a schematic diagram of a single $Al-Al_2O_3$ SET.

Figure 16:
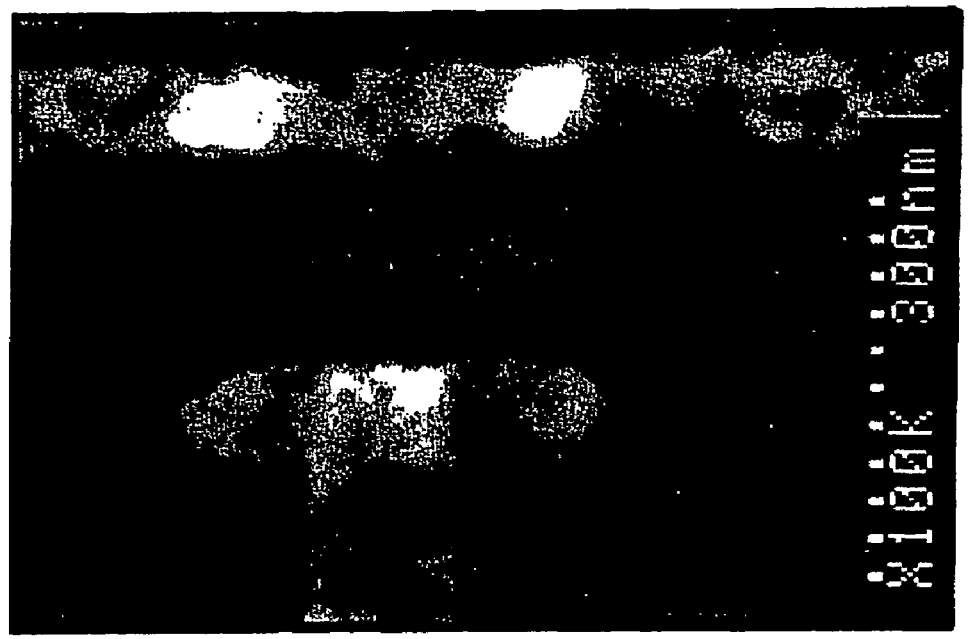

FIG. 16 is an SEM micrograph of completed SET device fabricated on a silicon wafer.

Figure 17:
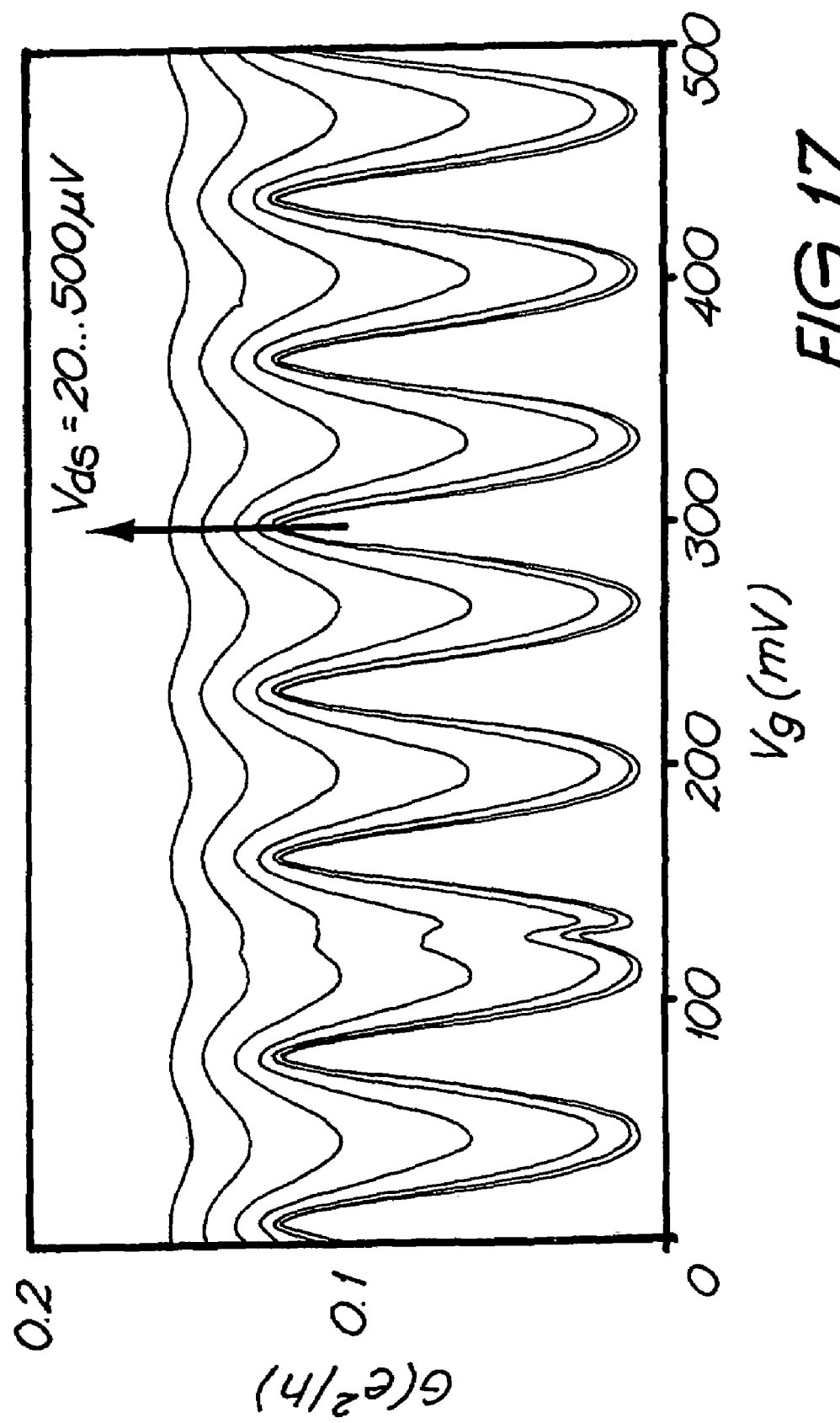

FIG. 17 is a low temperature conductance characteristic of the SET at different source-drain biases.

Figure 18:
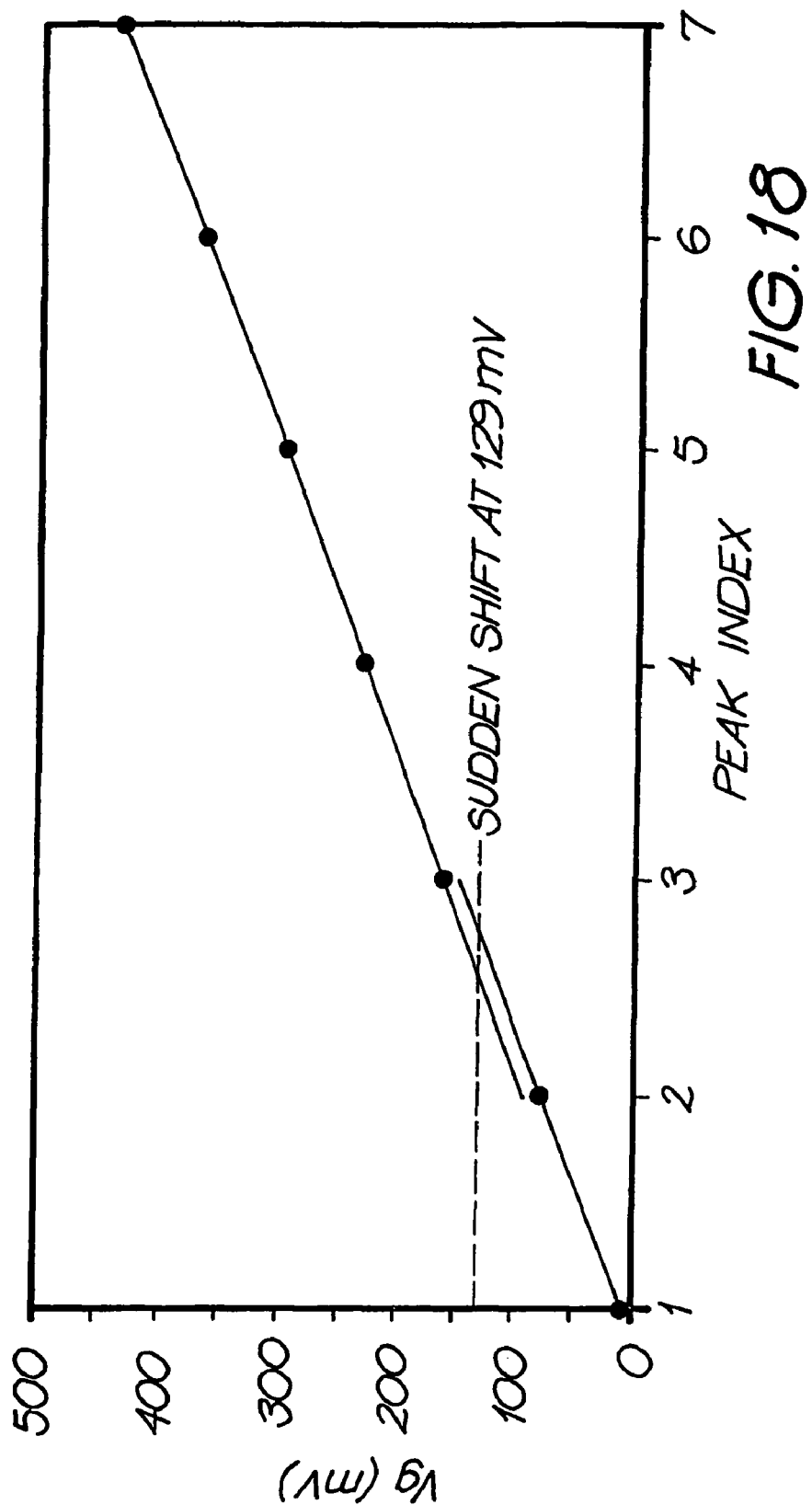

FIG. 18 is a graph of measured gate biases at which the SET conductivity is maximum, as a function of the peak index, showing the discontinuity at $V_g$=129 mV.

Figure 19:
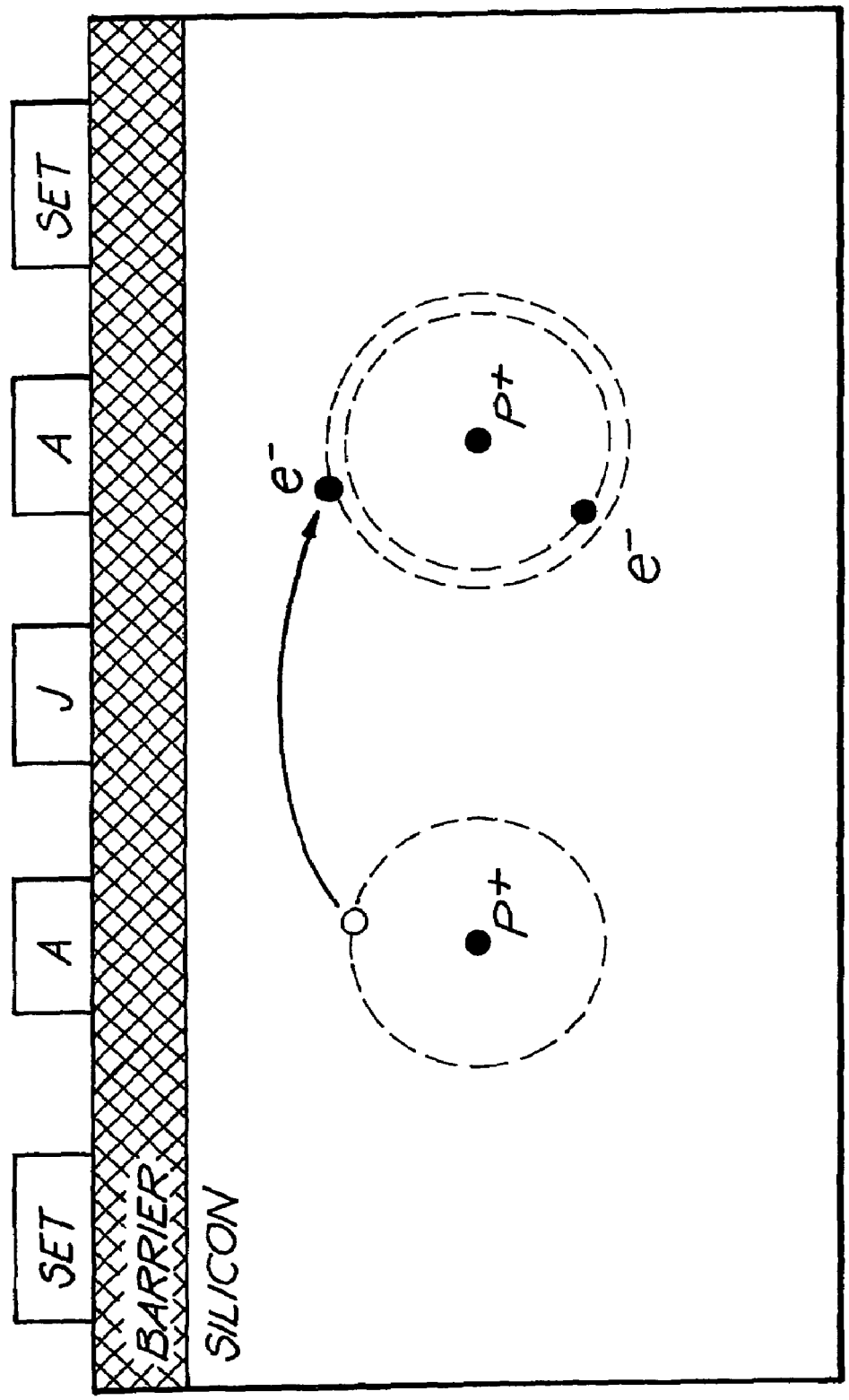

FIG. 19 is a schematic of the twin-SET architecture for detecting spin dependent tunnelling events.

FIG. 20 is a test structure for the twin-SET readout architecture.

FIG. 21 is data from a twin-SET device showing (a) tunneling current measured as a function of SET plunger gate voltage, exhibiting Coulomb blockade oscillations, and (b) a greyscale plot of source-drain voltage as a function of plunger gate voltage, allowing charging energies to be determined.

Figure 22:
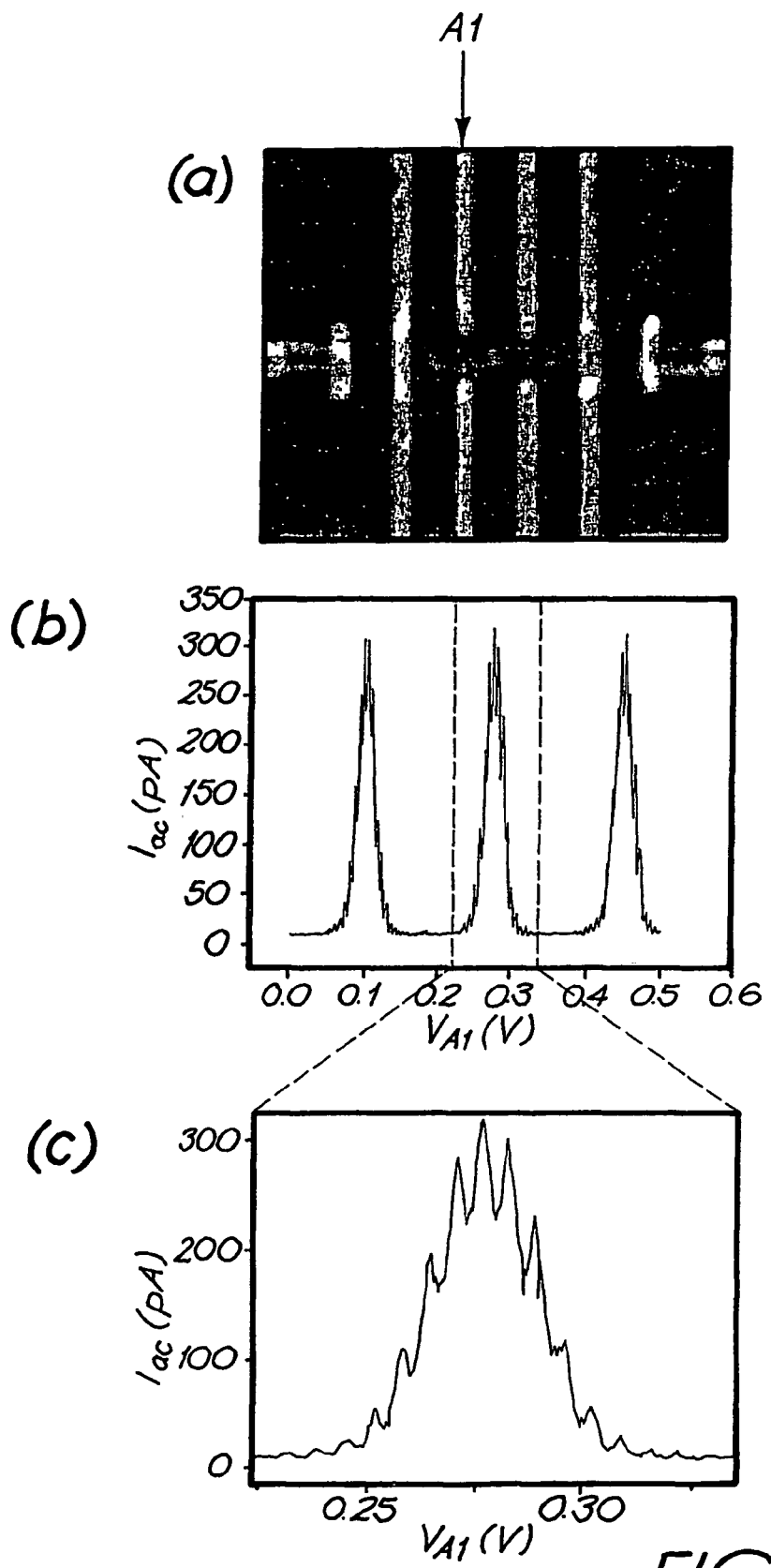

FIG. 22 is (a) an SEM micrograph of a twin-SET device, and (b) and (c) graphs of tunnelling current measured as a function of voltage applied to gate A1.

FIG. 23 is (a) an SEM micrograph of a twin-SET device, and (b) a graph of tunnelling current measured as a function of voltage applied to gate A1 (with $V_{A1}=-V_{A2}$), for three different plunger gate voltages.

BEST MODES OF THE INVENTION (i) SET-to-control Gate Alignment

In the nanoelectronic circuitry for the SSQC it is advantageous to integrate the conducting control gates (used to manipulate the nuclear or electronic spin of the qubit) in close proximity to SET devices (used to detect single charge displacement and hence perform qubit read-out). The control gates and SETs must also be aligned (or registered) to the underlying $^{31}$P donors, which constitute the qubits in the SSQC. We first consider the issue of SET-to-control gate alignment, using fabrication of a twin-SET read-out simulation device as a specific example. In section (ii) we extend this strategy to design a fully-configured few-qubit SSQC device, for which we need to apply control gate-to-donor alignment.

Various types of SET structures have been demonstrated, however, the most convenient for integrated SET-control gate architectures is the Al/Al$_2$O$_3$ structure, defined by EBL and double-angle shadow evaporation[5,6]. This is because the SET electrodes (source, drain, island and plunger) can be made from the same material, namely evaporated aluminium (Al), as the qubit control gates, allowing both types of conducting features to be deposited in a simultaneous process step. Since the gate-gate separation in a SSQC, which is around 20 nm for nuclear-spin qubits[1], or 200 nm for electron-spin qubits[3], is well below the resolution limits of optical ultra-violet (UV) lithography, it is necessary to use a high resolution process such as electron beam lithography (EBL), extreme-ultra-violet (EUV) lithography, X-Ray lithography or scanning probe lithography. The most convenient and well-developed of these is EBL.

Al conducting regions can be produced by either thermal evaporation or electron-beam evaporation of Al metal. The circuit pattern can be written using EBL (or some other technique) into a resist layer. After development of the exposed resist, the remaining resist forms a mask to the evaporated metal, thus transferring the pattern from the resist to an Al circuit on the surface of the substrate.

The SET-to-control gate self-alignment process would be simple if it were possible to deposit all of the Al features in one metal evaporation step, as described above. However, to form the Al/Al$_2$O$_3$ SETs it is essential to deposit the Al island electrode in a separate metal deposition from the Al source and drain electrodes. Between these two deposition steps the Al surface is exposed to a controlled dose of molecular oxygen (O$_2$) to form a controllably thin (approximately 1–10 nm) Al$_2$O$_3$ layer. This highly insulating Al$_2$O$_3$ layer between the source and island, and between the drain and island, acts as a barrier to electron motion except via quantum mechanical tunnelling, and is essential for the operation of the device as a single electron tunnelling transistor (SET).

Figure 1:
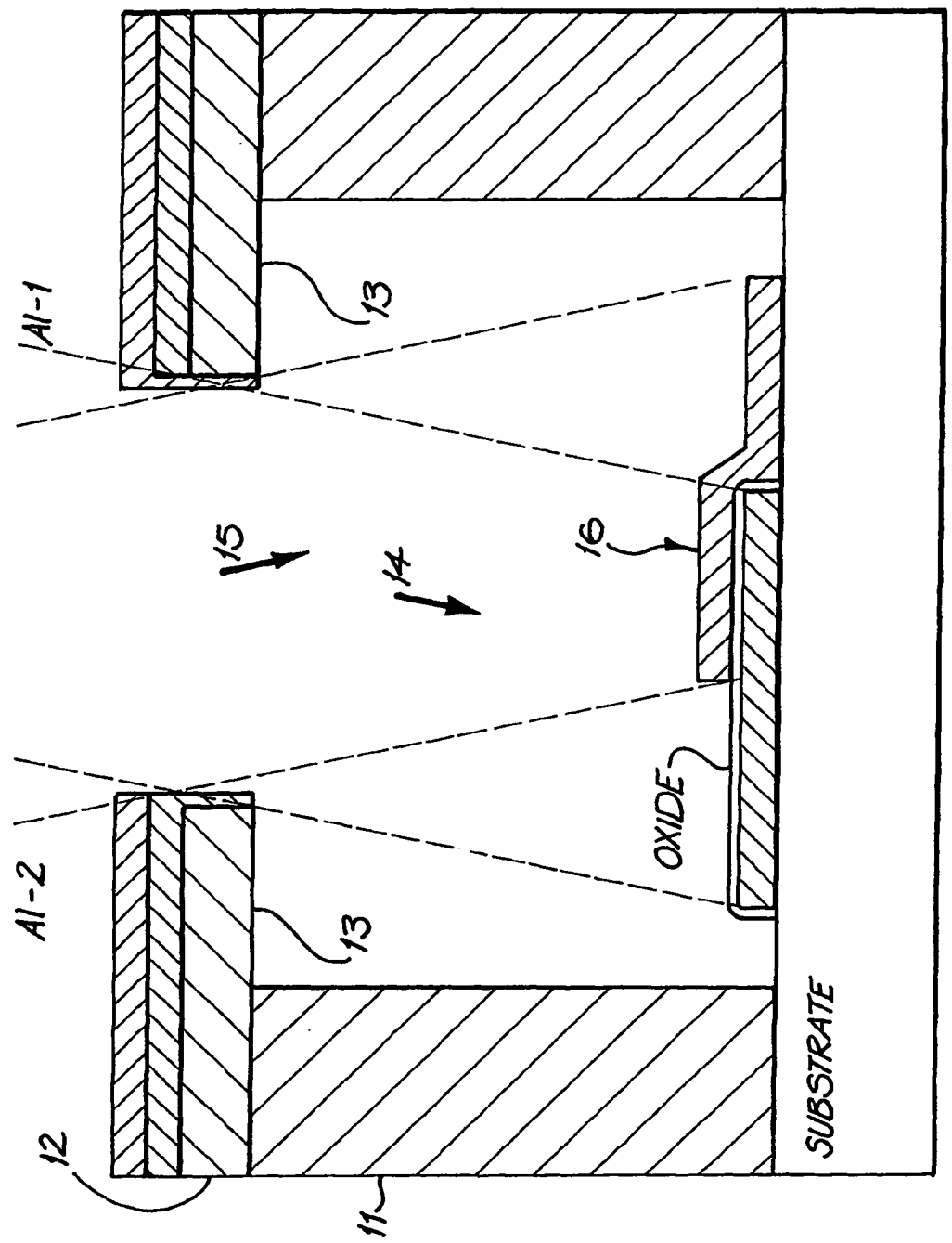
FIG. 1 is a schematic section of the double angle shadow evaporation technique.

Controlled Al/Al$_2$O$_3$/Al tunnel junctions can be fabricated using a process known as double-angle shadow evaporation depicted in FIG. 1, invented by Dolan using photoresis[5], and then used by Fulton and Dolan in 1987[6] for the first demonstration of an SET device using artificially fabricated tunnel junctions. Unlike more conventional fabrication strategies, this approach requires only one EBL exposure to fabricate the entire device, and also allows in-situ oxidation of the Al to form controllable tunnel junctions. A bilayer resist structure, in which the lower resist 11 is more sensitive to electron-beam exposure than the upper resist 12 is used to create resist profiles with large overhangs 13, as shown in FIG. 1. The overhanging resist 13 acts as a shadowing element for two Al evaporations 14 and 15. The Al is oxidised in the evaporation chamber between evaporations to form the tunnel barriers without breaking the vacuum[6].

The evaporations 14 and 15 are done from two different angles, so that the actual junction is formed at the overlapping region 16. The size of this overlapped region determines the tunnel junction capacitance and tunnel resistance and can be varied by changing the deposition angle.

Figure 2:
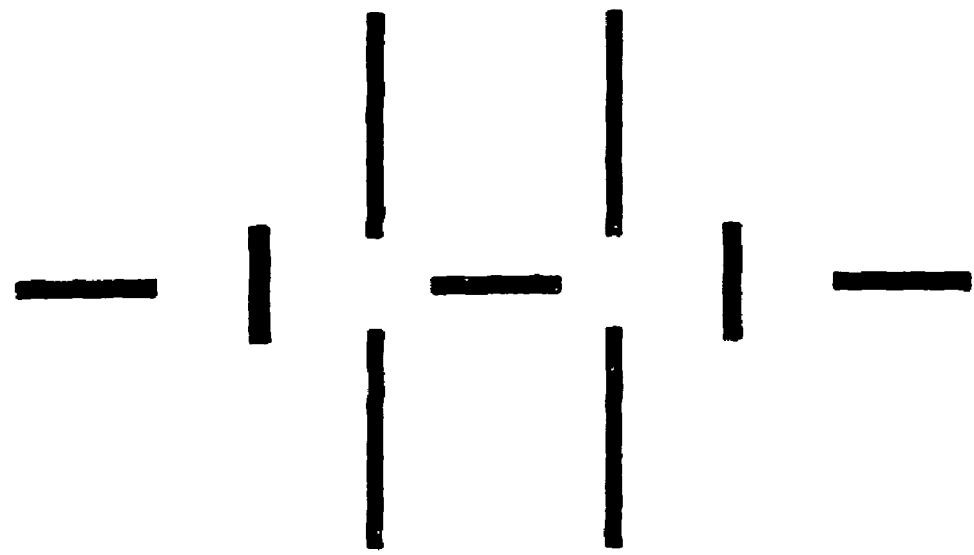
FIG. 2 is an EBL exposure pattern used in the technique to fabricate a twin-SET SSQC read-out simulation device.

In order to achieve SET-to-control gate self-alignment, it is necessary to design an EBL exposure pattern which self-consistently leads to both the SETs and the control gates, without producing undesired extraneous features. An example of such a pattern is shown in FIG. 2. This pattern, after double-angle shadow evaporation, then produces a twin-SET read-out simulation device, although the basic concept can be equally applied to the metallisation circuitry for a complete multi-qubit device incorporating $^{31}$P donors, as discussed in (ii) below.

Figure 3:
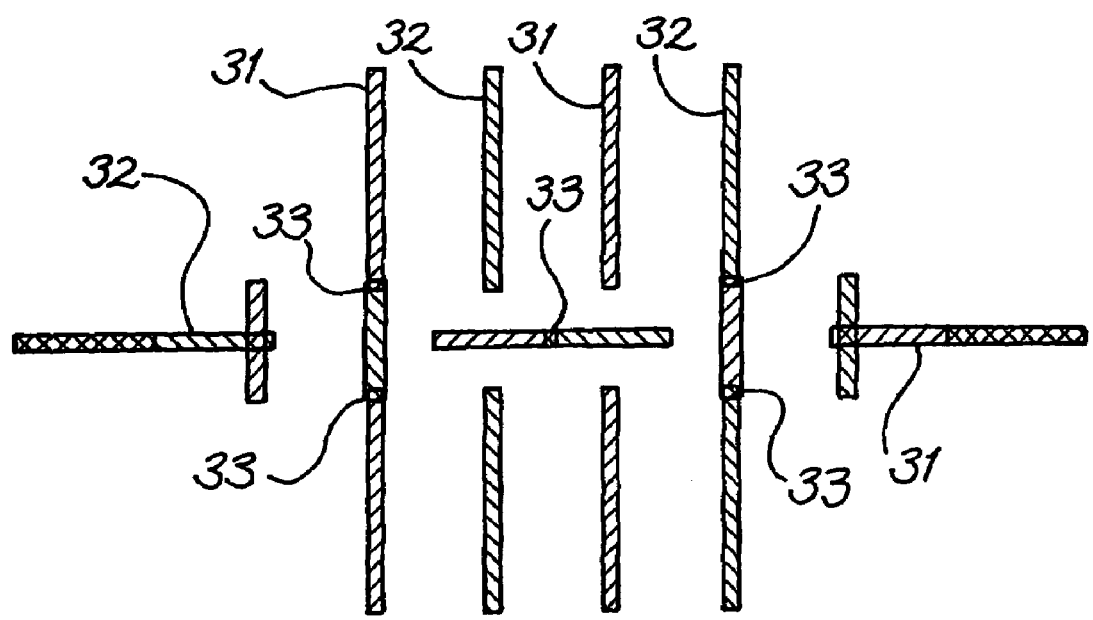
FIG. 3 is the self-aligned SET-control gate array resulting from double angle shadow evaporation of the pattern in FIG. 2.

FIG. 3 shows the complete self-aligned SET-control gate array of the twin-SET device after the double-angle shadow evaporation. In this figure, the regions 31 depict the metal deposited from the first Al evaporation, and the regions 32 depict the metal deposited from the second Al evaporation. The regions 33 depict the small regions where the two layers overlap, separated by a thin Al$_2$O$_3$ layer.

Figure 4:
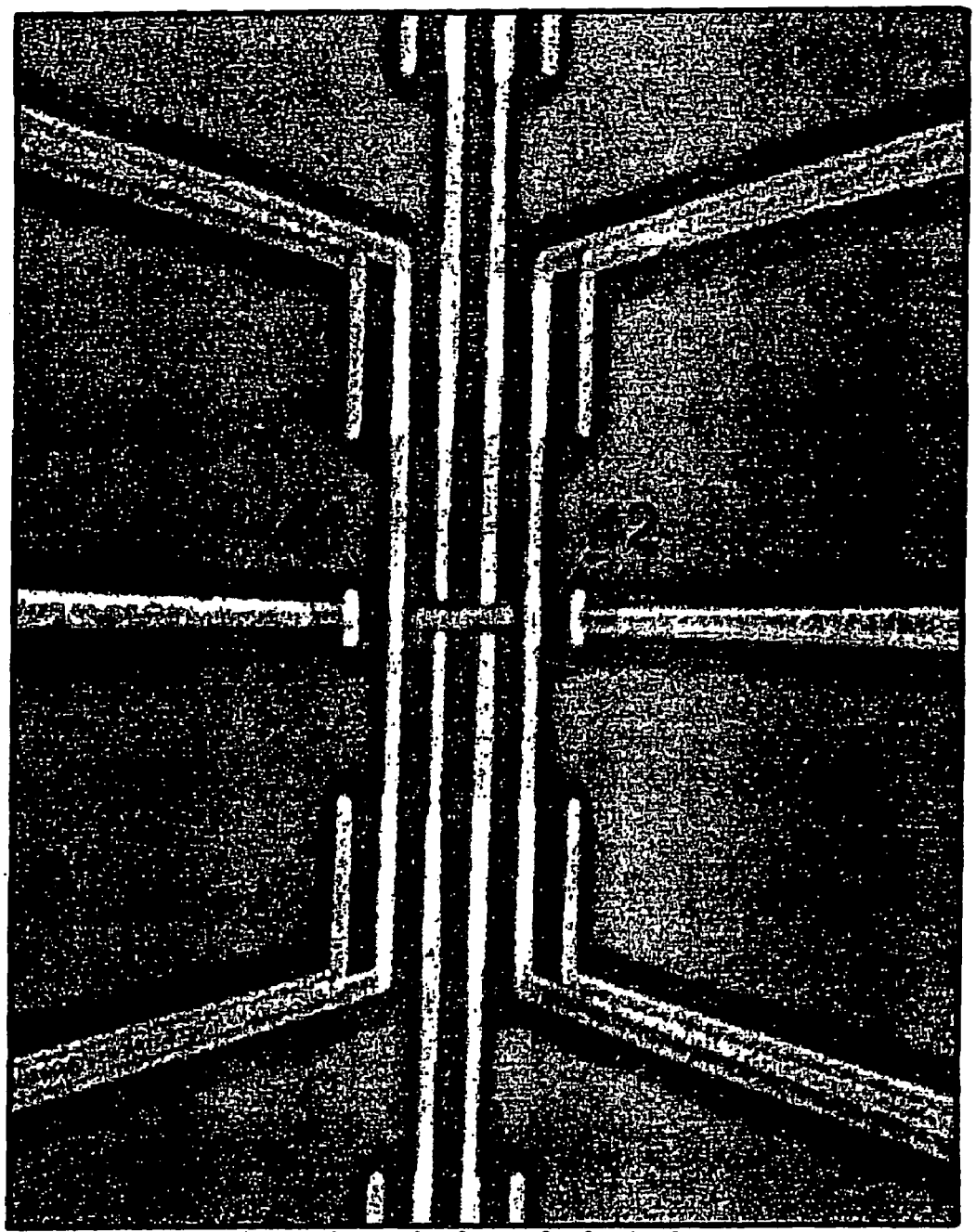
FIG. 4 is a scanning electron microscope (SEM) image of a complete fabricated twin-SET device, with double island architecture for SSQC readout simulation.

A fully fabricated twin-SET device is shown in FIG. 4. A Leica Lithography Microsystems EBL-100 system at UNSW, with 3 nm ultimate spot-size, was used to define the initial pattern, as shown in the schematic of FIG. 2.

The centre-to-centre distance of the two SET islands 41 and 42 is 750 nm, while the entire nanostructure (plunger-to-plunger) is contained within 1400 nm. The width of the individual control gates, together with the source and drain electrodes of the SET, is 60 nm. All of these feature sizes can be reduced by a factor of ten, or greater, by improving the EBL spot-focus and adjusting the resist parameters. The ultimate EBL resolution limit is set by the resolution of the electron-sensitive resist used, which for PMMA has been shown to approach 5 nm[8]. The dimensions of the device shown are adequate for devices incorporating $^{31}$P as electron spin qubits[3]. For devices incorporating $^{31}$P as nuclear spin qubits[1], it would be necessary to perform EBL at the current limit of resist resolution[8].

We now outline the specific process details for fabrication of the device shown in FIG. 4.

The bilayer resist structure uses a P(MMA-MAA) copolymer for the more sensitive lower layer, which has a nominal thickness of 450 nm and a composition of 17.5% MAA in MMA. The sensitivity of the copolymer layer is increased by a deep-UV flood exposure for 90 minutes. The less-sensitive upper layer is PMMA of thickness 60 nm and average molecular weight 950,000. After EBL exposure using an EBL-100 lithography tool, the resist is developed in a 2.7:1 solution of IPA:MIBK. Al is deposited from two different angles using a thermal evaporation system, with the angles determined by the offset necessary for accurate self-alignment of the pattern. Each of the two Al layers has a thickness of 30 nm. The $Al_2O_3$ tunnel barrier is produced by exposing the surface to a pressure of 200 mTorr of $O_2$ for 3 minutes between the two evaporations.

While control gate-to-donor alignment is absolutely critical for the SSQC, it may be possible to relax the alignment of the SETs to the control gates and donors, due to the very high charge sensitivity of the SETs. In this case, one could deposit the metal for the SETs in a separate metal evaporation step from that used to deposit the gates. The gates could then be produced in an initial EBL exposure on a single layer resist, while a later EBL exposure in a bilayer resist could produce the $Al/Al_2O_3$ SETs. The control gates could then be made from a metal other than Al, which may have a lower diffusion rate through the $SiO_2$ surface barrier layer. Furthermore, the SETs could then be deposited after the ion implantation and annealing steps, which would allow the use of high (>400° C.) annealing temperatures which would be more effective in removing the lattice damage created by the ion implantation process which could impair SSQC operation. Annealing carried out after SET deposition is limited to lower temperatures as the quality of $Al_2O_3$ tunnel barriers may be degraded above 400° C.

(ii) Control Gate-to-donor Alignment

In addition to the alignment between SETs and control gates it is necessary to position the $^{31}P$ dopants, which constitute the qubits in the SSQC, directly under the A-gates, or under the SETs. This requires control gate-to-donor alignment.

Two contrasting techniques may be considered for the placement of $^{31}P$ donors in a SSQC. The first utilises a 'bottom-up' design to construct the $^{31}P$ donor array at an atomic level using scanning probe lithography. The second uses a 'top-down' design in which $^{31}P$ donors are injected the required depth into the structure (5–100 nm below the surface) using ion implantation, either before or after deposition of the SETs and control gates. A regular qubit array can be achieved by using a mask which is resistant to the $^{31}P^+$ions, in which a series of holes have been defined at the appropriate spacing. Ion implantation through a mask is an existing industrial semiconductor process. This idea was first discussed as a means of producing a 2-donor SSQC test device based on electron spins by Vrijen et al.[3]

Due to the random distribution of ion positions laterally during implant, the 'top-down' fabrication route is statistically only feasible for few-qubit structures. This has been discussed by Vrijen et al.[3], who point out that if the ion-implantation dose is adjusted so that on average only one $^{31}P^{30}$ ion would pass through a hole in the mask, then by Poissonian statistics the probability of getting exactly one $^{31}P$ ion is $P_1$=0.367. (Note that $P_1$ is not 0.5 since there could be 0, 1, 2, 3 . . . ions in each hole.) The probability of obtaining exactly N adjacent donor positions with exactly one $^{31}P^+$ion is then $P_N = P_1^N$. For a 4-donor system (which could be used for a 2-qubit device with nuclear-spin qubits and SET read-out) this produces a yield of $0.367^4$=0.018, or roughly 1 in 50.

Although low in yield, it is possible to envisage techniques whereby the passage of an ion marks the relevant location in some detectable way, thereby allowing perfectly configured devices to be chosen for subsequent processing. One proposal is to use a monolayer film of $^{60}C$ molecules on the surface prior to implantation, since these are known to fragment following ion bombardment by a single ion.

The $^{31}P$ donor array, produced by the 'top-down' (ion implantation through a mask) technique, must still be aligned (registered) to the SET and control-gate circuitry to an accuracy better than half the width of a control gate.

This is achieved using a technique of self-alignment in which alignment in one lateral direction (say the x-direction) is obtained using a single EBL pattern exposure. A second EBL pattern is then exposed to provide positioning in the y-direction. These patterns could be exposed in either order, depending on the ordering choice of the resist layers used for a specific process. The alignment of one pattern to the other will require one EBL alignment step, which would introduce a maximum misalignment in the y-direction of $\Delta y^{max}$=100 nm between the array of $^{31}P$ dopants and the SETs used for qubit read-out. The exact value of $\Delta y^{max}$ is set by the registration accuracy and technique of the EBL tool to be employed. Such a misalignment is acceptable due to the high degree of charge sensitivity of SET devices. Alignment in the x-direction is perfect (i.e. $\Delta x^{max}$=0), due to the self-alignment procedure detailed below.

Figure 5:
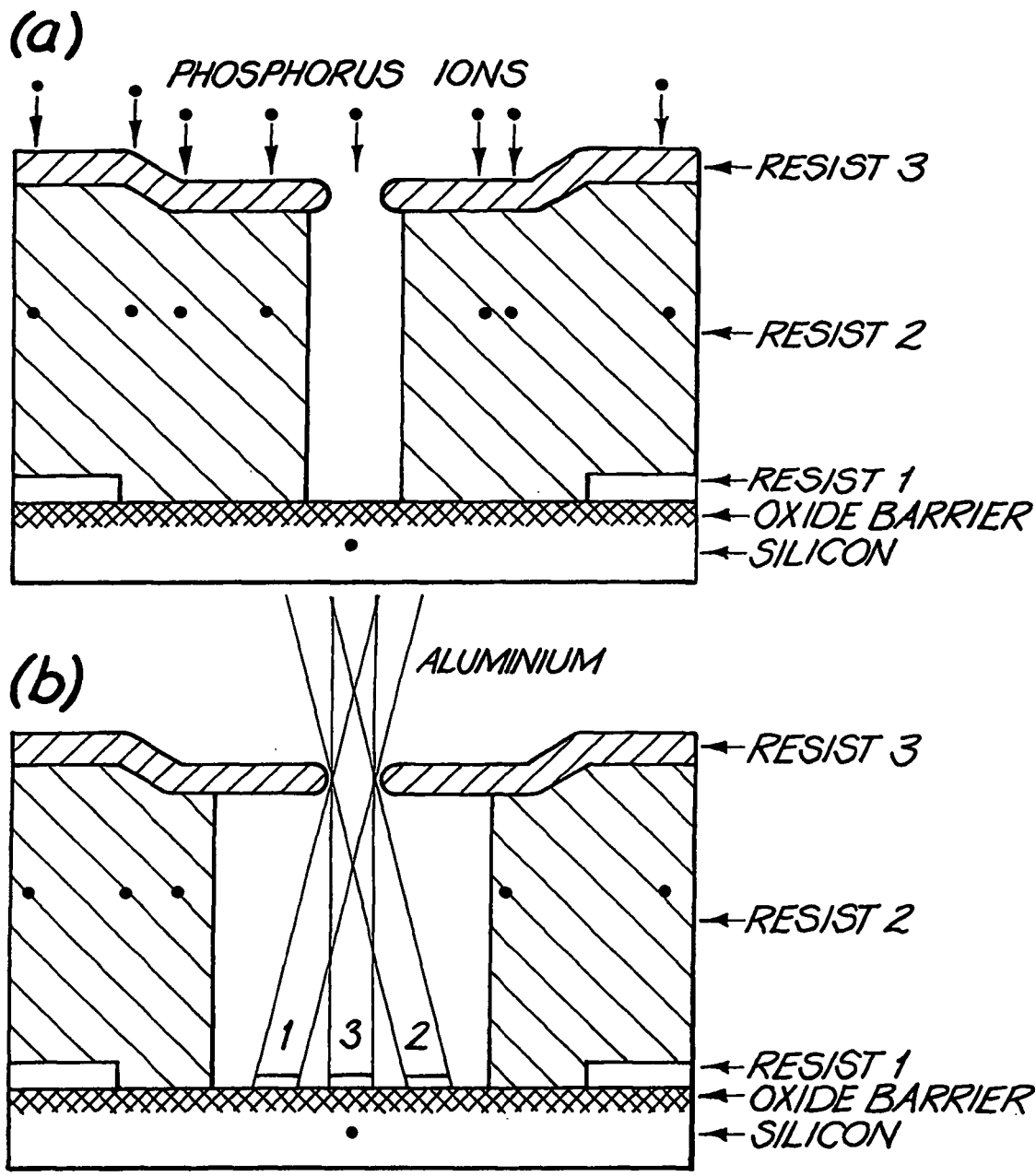
FIG. 5(a) is a schematic section showing the triple-layer resist profile for the ion-implantation step, while (b) shows the resist profile for the triple-angle shadow evaporation steps.

The fabrication process steps are now spelt out in detail. They involve a tri-layer electron-sensitive resist process, two stages of EBL exposure, ion implantation as shown in FIG. 5(a), and a triple-angle shadow evaporation process, as shown in FIG. 5(b).

Test Case I: 4-Donor Device

Figure 6:
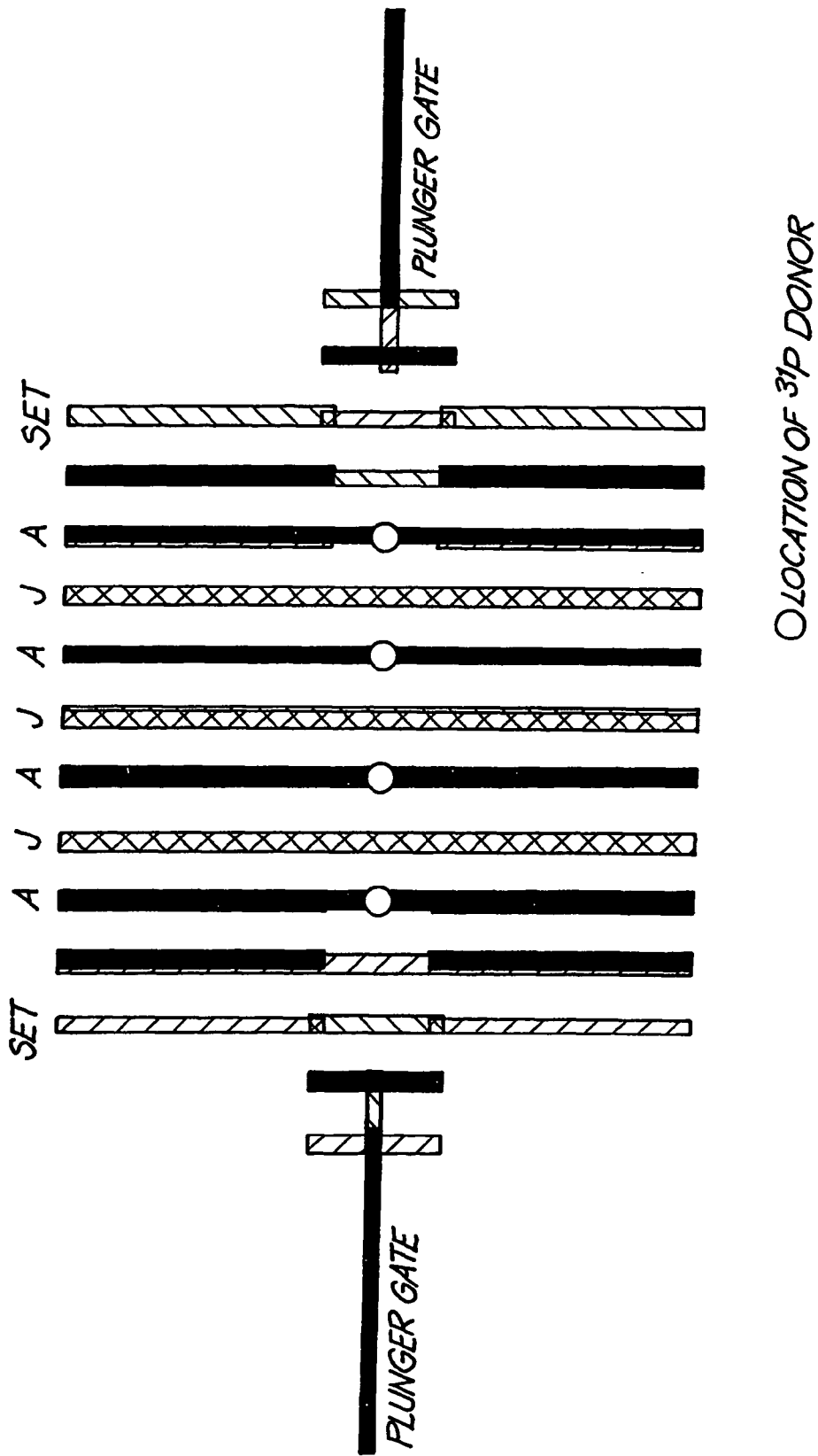
FIG. 6 is a schematic showing a complete 4-donor SSQC device, with SET read-out at either end, capable of production using the technique.

As an initial test case we consider the 4-donor device of FIG. 6, with four adjacent $^{31}P$ donors, each with a controlling surface A-gate above, and a coupling surface J-gate in between. In addition, we have a read-out SET (with plunger gates) at each end of the array. The device also has two additional gates between the SETs and the outer donors, which are a by-product of the triple-angle shadow evaporation fabrication process that is employed. If electrically floated, these gates could be used to selectively couple the SETs to the outer donors during the read-out cycle of the computation only. The high sensitivity of the SETs should still ensure that read-out is possible in this case. During the calculation cycle, when unintentional read-out would lead to decoherence, these gates could be grounded, to shield the SETs from the donors.

It is stressed that there are many alternate SET and gate arrangements which could be used with the process described here and that shown in FIG. 6 is used for representative purposes only.

The 4-donor device depicted in FIG. 6 may be fabricated using a process flow such as that schematically presented in FIGS. 7(a) to 7(h). Each of the process steps will now be discussed in turn. The process parameters given are typical values only.

1. Oxide Formation:

Grow high quality oxide (typically 2–10 nm) on a high quality silicon substrate.

2. Electron Beam Lithography Written Alignment Marks:

Coat the wafer with 50 nm 950,000 to 2,000,000 molecular weight PMMA, write vernier comb and coarse alignment marks, develop the pattern, deposit 10 nm titanium (Ti) metal and 40 nm gold (Au) metal, lift-off excess metal and clean the wafer. Other materials, such as platinum, palladium, or polysilicon may be used as the alignment marker, depending on pattern recognition by the EBL.

3. Define Locus for Ion Implants (Pattern A):

Coat the wafer with resist 1, which may be a resist such as PMGI (ie., electronbeam- and photo-sensitive and/or ion-sensitive resist). Note: the resist process will be designed such that resist 1 uses a different developer solution than resists 2 and 3, and also, so that it undergoes minimal intermixing with resists 2 and 3.

Align to the EBL alignment marks (+/−100 nm) and write pattern A, which defines the locus for subsequent ion implants. Develop pattern A with the selective developer (AZ351 would be used for the PMGI resist) and flood expose the surface with DUV 240 to 280 nm wavelength to sensitise the PMGI resist to aid its removal in step 6. Note: The DUV sensitisation may also be done after the ion-implantation (step 5). Note: resist 1 could also be formed by plasma deposition of an inorganic resist, such as $Si_3N_4$, followed by coating with an organic resist such as PMGI. The cross pattern would then be written with EBL into the organic resist and developed, after which the inorganic resist would be developed using an appropriate etchant. The advantage of this approach is that, in later processing (see step 6), the inorganic etchant would not develop the subsequent resist layers, and the organic developer would not develop this organic resist.

4. Pattern B Formation on Copolymer/PMMA Bilayer Resist:

Coat the wafer with resist 2, which may be a copolymer such as P(MMA-MAA) (8% to 25% of MAA in MMA depending on process requirements) and then with resist 3, which may be PMMA (950,000 to 2,000,000 molecular weight PMMA, although a hard mask material such as germanium (Ge) or silicon dioxide ($SiO_2$) may be considered), align to the EBL alignment marks and expose with EBL pattern B for the SETs, A and J gates.

Figure 7B:
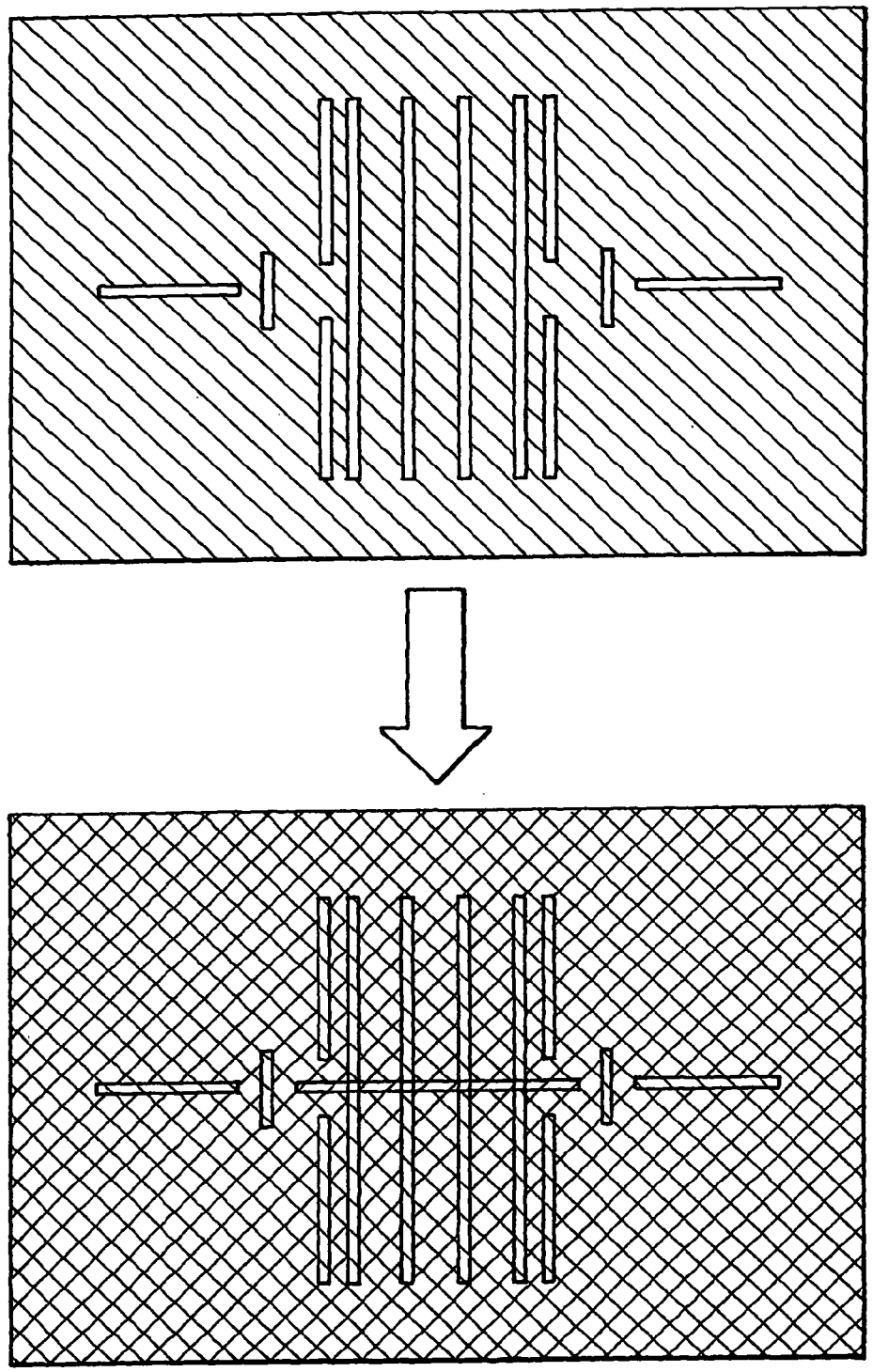
FIG. 7 is a series of fabrication process schematics to make the device in FIG. 6, having the following steps.

Partially develop the exposed PMMA and copolymer layer with the PMMA developer (2:1 IPA:MIBK) so that the resist profile appears as in FIG. 5(a), corresponding to a series of trenches in resists 2 and 3 of width 5–50 nm where pattern B is defined (see also FIG. 7(b)). Note that the crossing of patterns A and B produces a series of four holes in a straight line (white regions in FIG. 7(b)) where the $Si/SiO_2$ substrate is fully exposed.

Figure 7C:
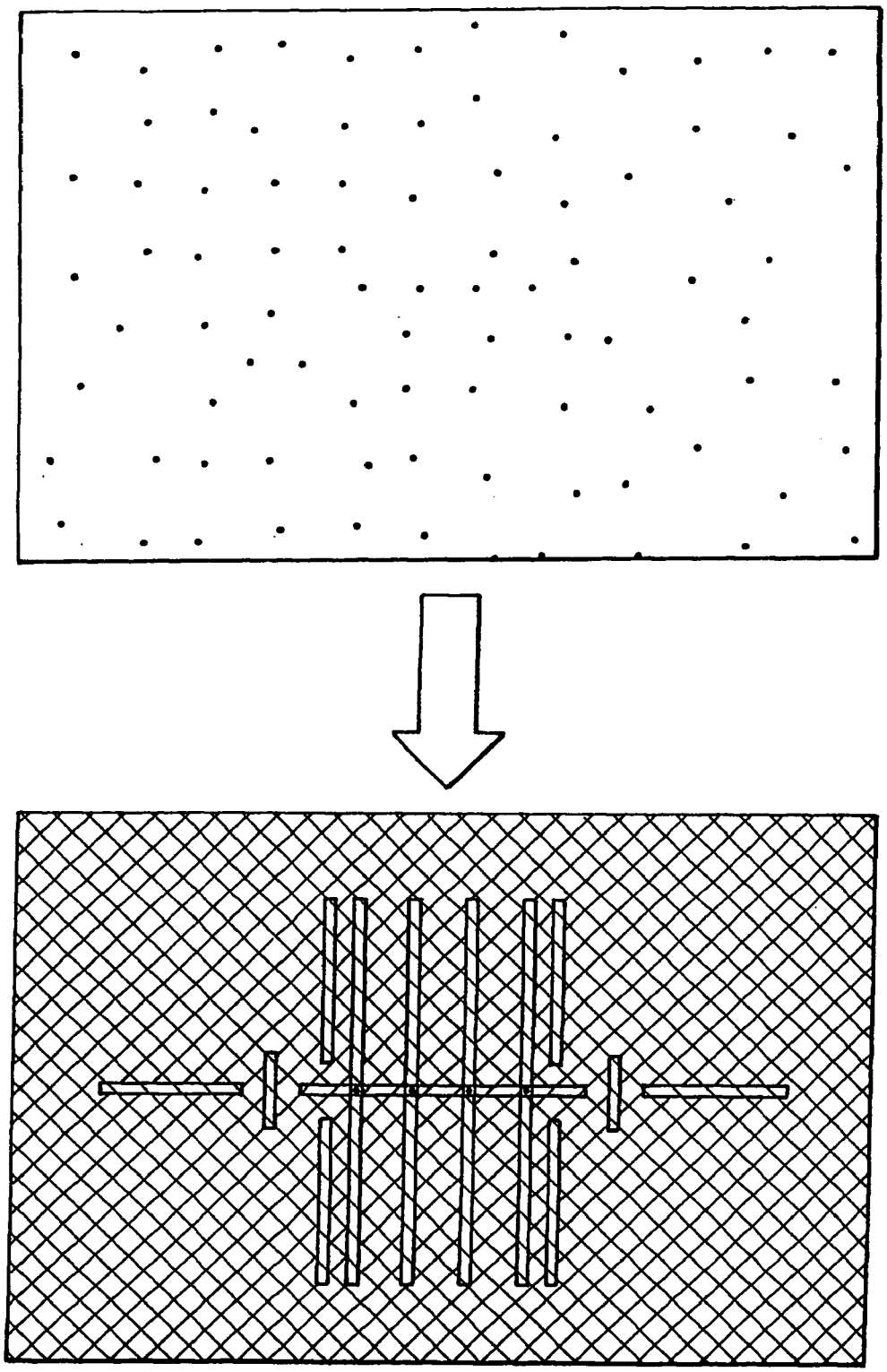

5. Self-Aligned Dopant Implant:

Implant with $^{31}P$ ions with an areal dose such that, on average, one ion would land in each hole (see FIG. 7(c)). For a hole diameter of 20 nm this would correspond to a dose of typically $10^{11}$ ions/cm$^2$. The ion source may be gaseous $PH_3$ or a solid P source and the implant energy may be 1–15 keV, as necessary for the required implant depth.

Figure 7D:
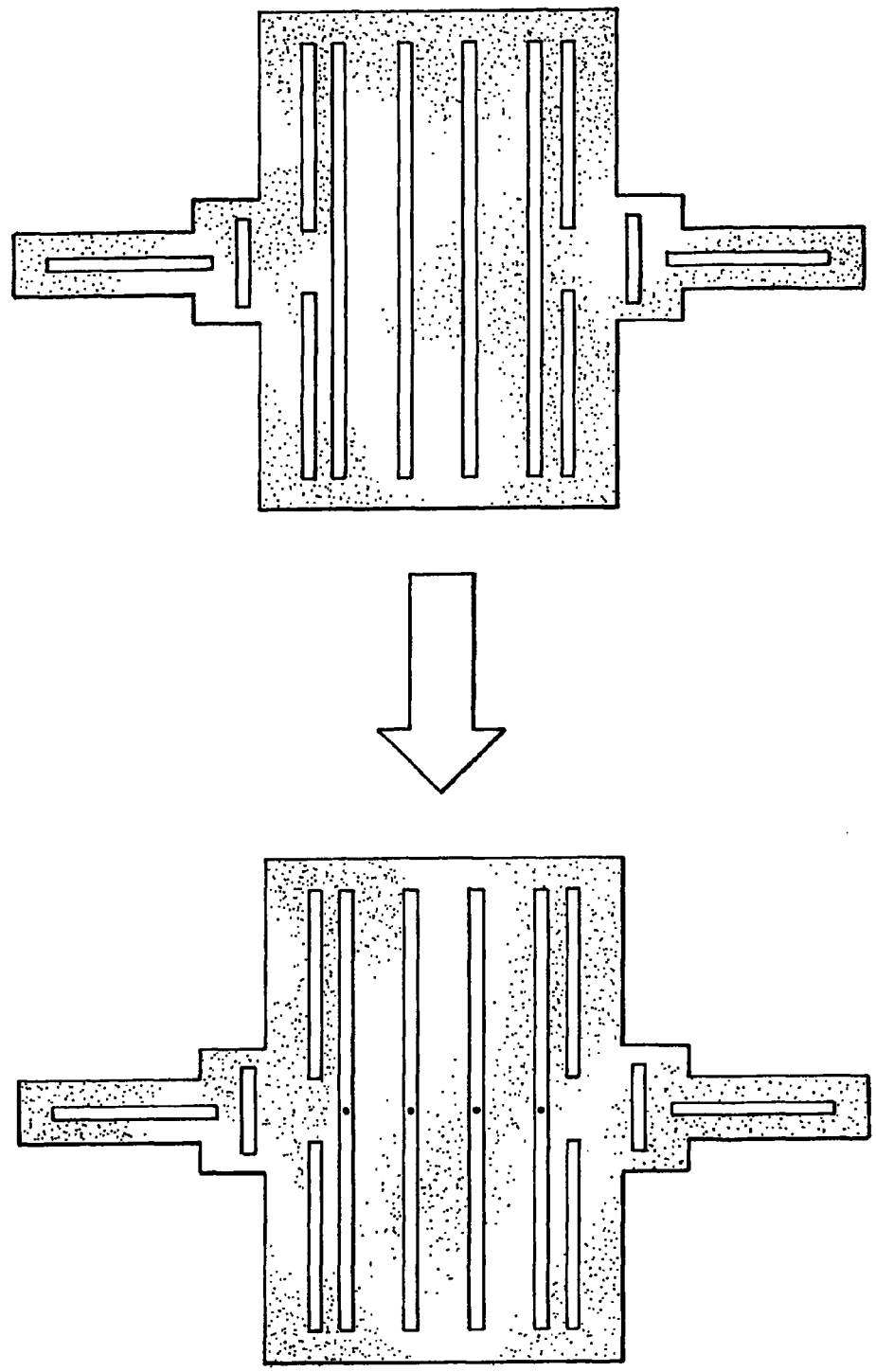
Figure 7E:
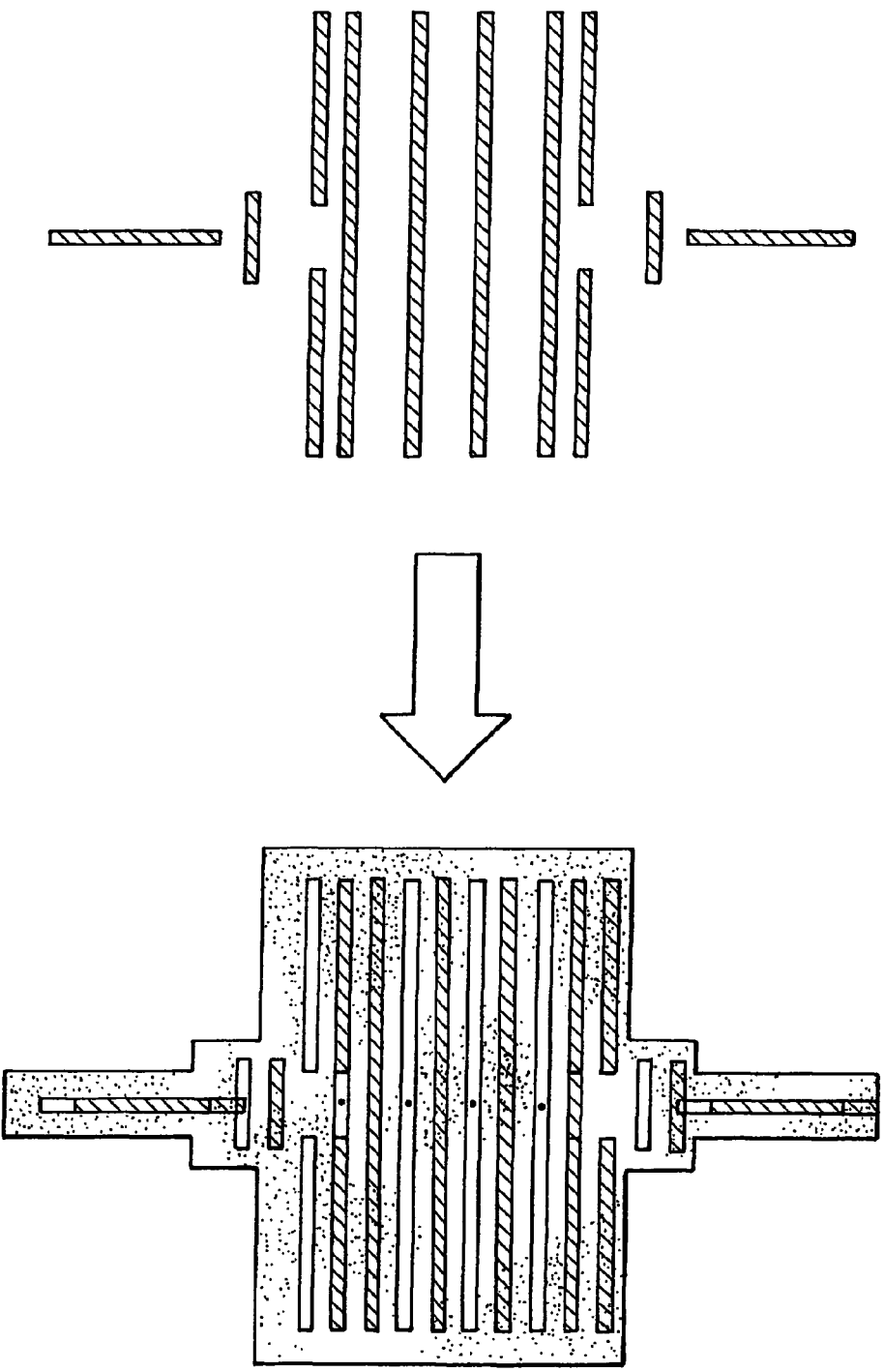
Figure 7F:
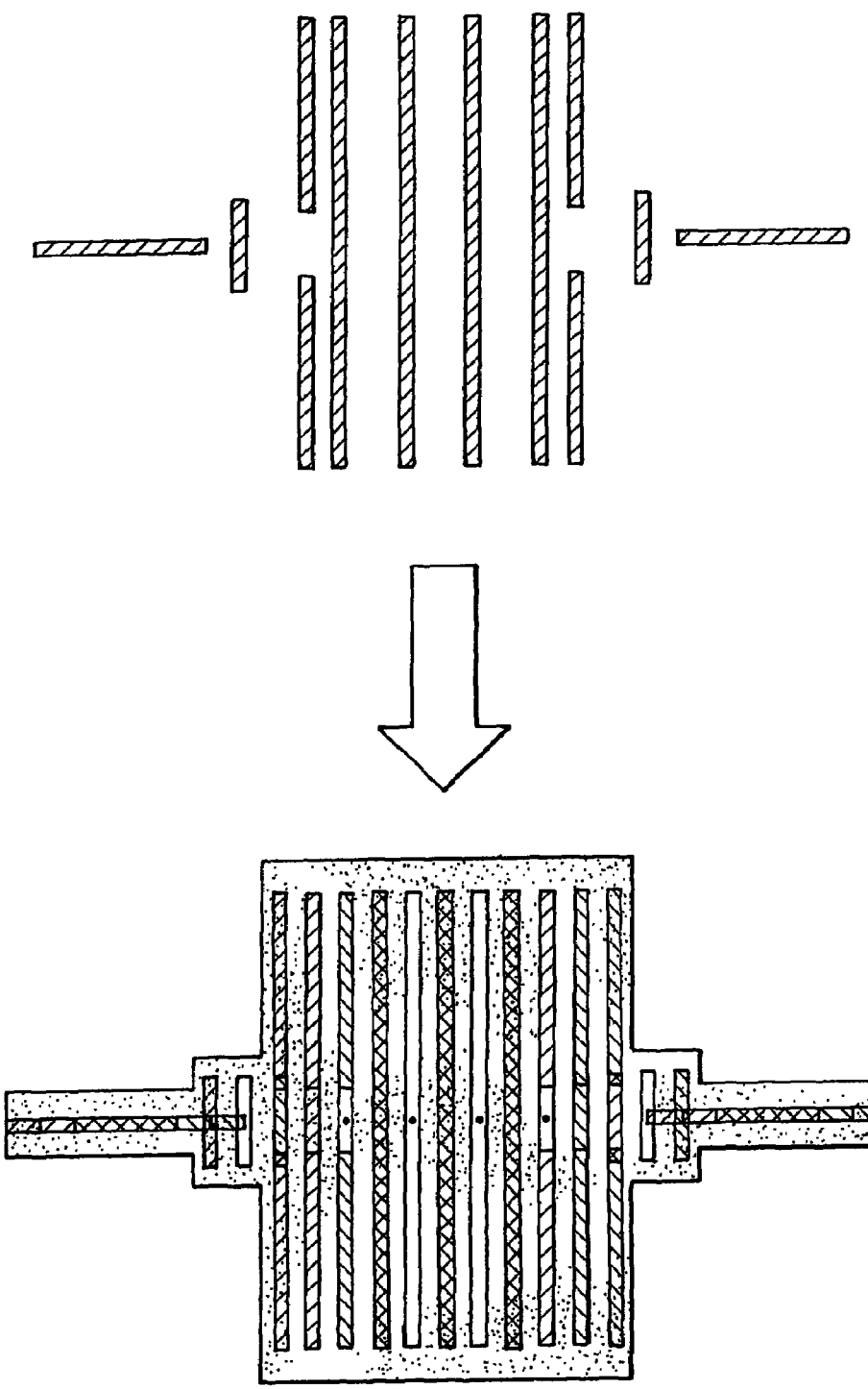
Figure 7G:
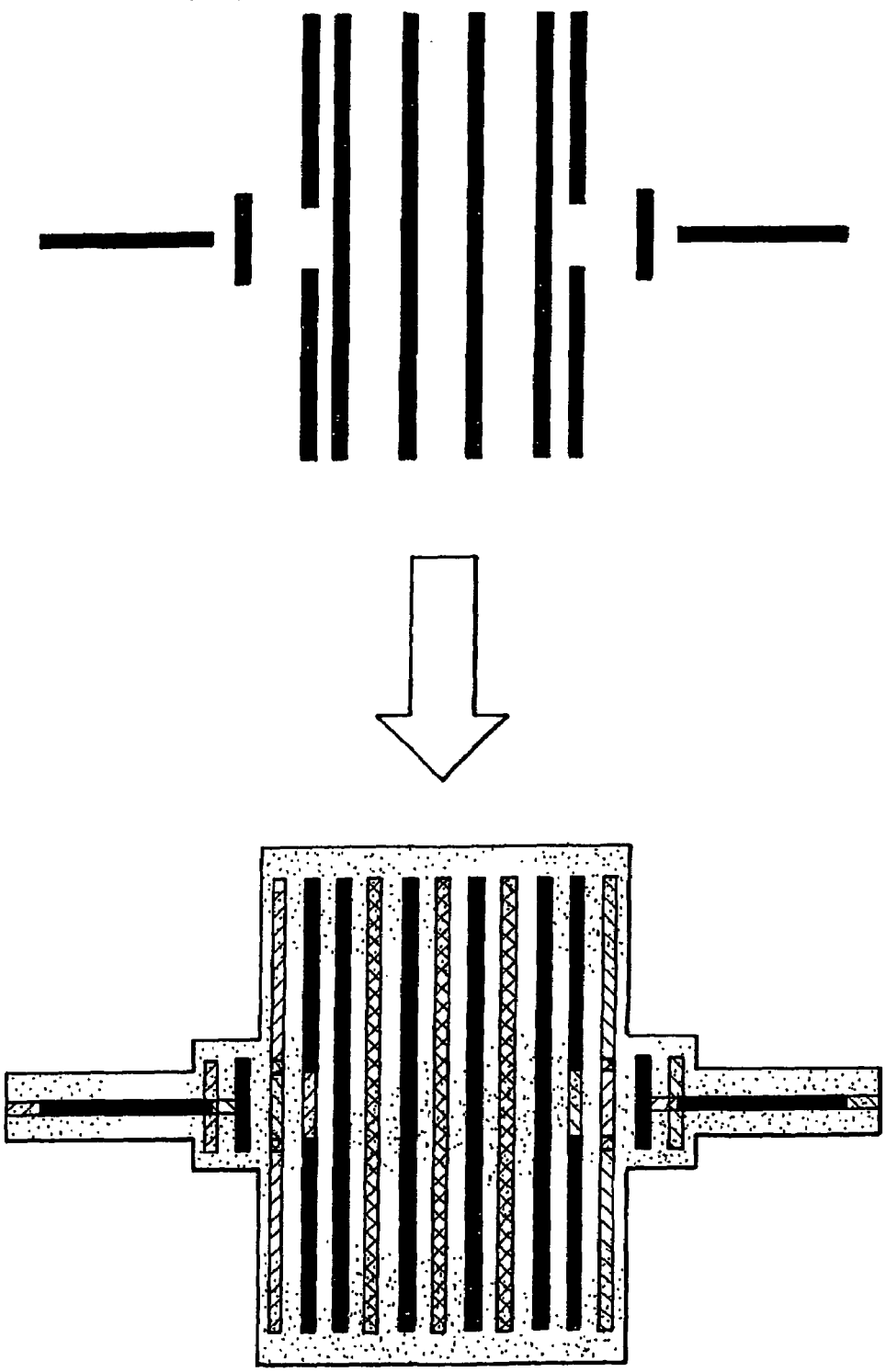
Figure 7H:
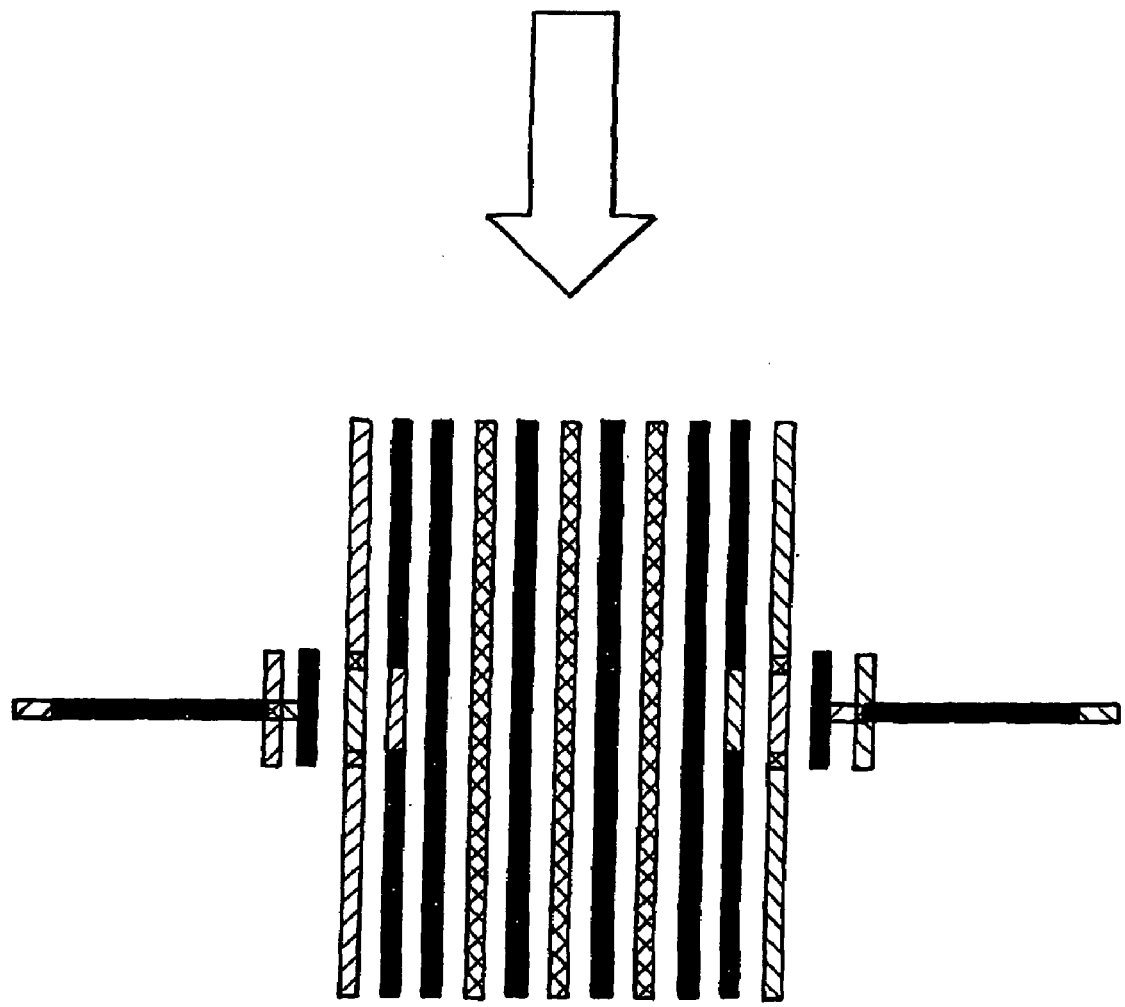

6. SET and Gate Pattern Develop:

Fully develop the SET and gate pattern (pattern B) with the PMMA/copolymer developer to produce an undercut profile as depicted schematically in FIG. 5(b) and FIG. 7(d).

Remove (strip) the bottom layer of resist 1 (PMGI) with the selective aqueous developer (such as Microchem Corporation 'AZ351' developer). Note that resist 1 will only be removed up to the edges of the cavity and will remain beneath undeveloped regions of resist 2 (the copolymer). Note also that an aqueous stripping solution (such as Microchem Corporation 'Nano Remover PG' Photoresist remover) could be used to remove the PMGI, which would eliminate the requirement to sensitise it with DUV in step 3.

7. First Angle Evaporation:

Using a positive angle such as 12.5 degrees (dependent upon the final resist thickness and pattern separation required), evaporate 30–40 nm gate metal (Al), then oxidise 1–2 nm Al to form the $Al_2O_3$ tunnel barrier for the SETs. Other conducting layers and SET barriers may be used as required.

8. Second Angle Evaporation:

Using a negative angle such as minus 12.5 degrees, evaporate 30–40 nm gate metal (Al).

9. Third Angle evaporation:

Using a zero degree angle, evaporate 30–40 nm gate metal (Al).

10. Metal Lift-Off:

Lift-off all layers in solvents to reveal completed device. Passivate or glassivate the surface as required.

11. Annealing:

Heat (anneal) the sample to a temperature, and for a time, necessary to activate the $^{31}P$ donor ions and to anneal out damage which may have resulted from the implantation process (step 5). The specific details of the annealing process will be a compromise between the need to remove implantation damage, and the need to minimise both ion diffusion and potential damage to the SET devices.

FIG. 8(a) is an image of a partially-developed tri-layer resist utilising PMGI, copolymer and PMMA (from bottom to top), with crossing line arrays exposed using EBL. The vertical lines were EBL exposed in the PMGI on a pitch of 2 μm and then developed. Copolymer/PMMA was then spun onto the sample and the horizontal lines were EBL exposed in all layers on a pitch of 5 μm. Partial development with 1:1 IPA:MIBK opened trenches in the copolymer/PMMA, but left the PMGI unaffected, as required. After etching with a hydrofluoric (HF) acid solution, atomic force microscope images shown in FIGS. 8(b) and 8(c) confirmed that etch pits were formed only where lines crossed each other. This result confirms the mutual compatibility of the three resists used for this process.

Test Case II: 6-Donor Device

As a second example, we consider the fabrication of a SSQC device, which incorporates six $^{31}P$ donor ions, with SET read-out devices at either end (see schematic in FIG. 9). The central region of this design incorporates the same philosophy as for the 4-donor design, and indeed, it is possible to continue adding A- and J-gates indefinitely to create N-qubit devices with large N. The limitation on this approach is that the probability of achieving a device with exactly one $^{31}P$ donor under each A-gate decreases with N with a probability $P_N=P_1^N$, where $P_1=0.367$.

The process flow for the 6-donor device is identical to that given above for the 4-donor device, except that a different EBL pattern is used for the SETs and gates (step 4). This pattern is shown in FIG. 10. Note that this pattern has a slightly different layout in the vicinity of the SETs.

FIG. 11 includes an SEM micrograph showing the complete SET and A- and J-gate circuitry for the 6-donor device, deposited using the triple-angle Al deposition described in the process flow. The darker regions in the SEM image show the extent of the undercut profile present in the copolymer (resist 2). Note that the PMMA layer (resist 3) was therefore self-supporting over a distance of order 2 μm. The diagram below the SEM image in FIG. 11 shows a schematic cross-section along the line XY. The schematic shows the intended locations of the $^{31}$P ions, although ion implantation has not been carried out on this sample. Note that due to the EBL pattern design, the J-gates in the circuit have two layers of metal deposited on top of each other. This leads to slightly wider J-gates than A-gates (see SEM image in FIG. 11), however, it is still possible to achieve narrow J-gates if the deposition angles are accurately controlled. This is demonstrated in FIG. 12, which shows a double-angle metal deposition of J-gates, using the EBL pattern of FIG. 10, and in this case the gate width is only 45 nm. In this case the third (zero) angle deposition has not been carried out, so no A-gates are present.

Test Case: 2-Donor Device

As a third example, we consider the fabrication of a SSQC device which incorporates two $^{31}$P donor ions and SET readout devices beside each donor (see FIG. 13).

Figure 13A:
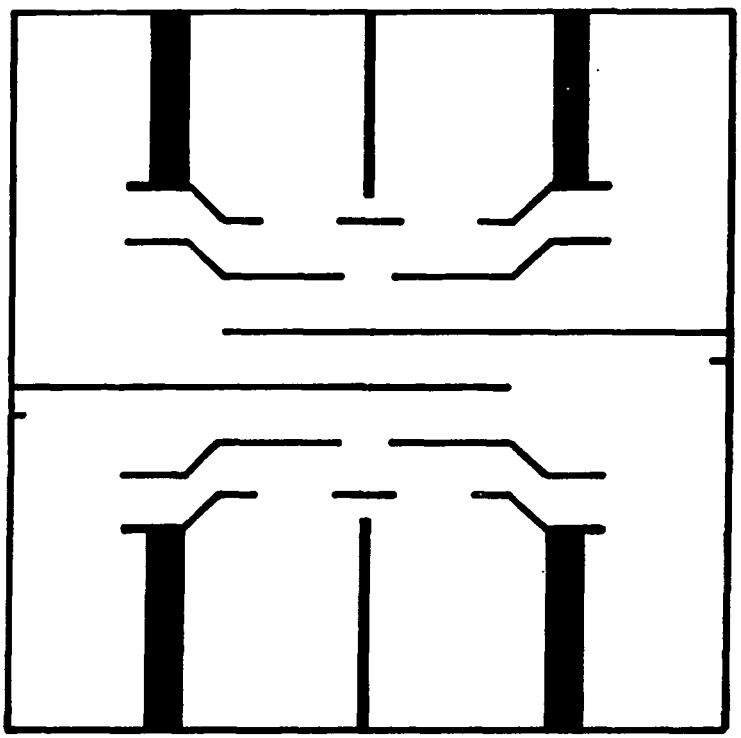
Figure 13B:
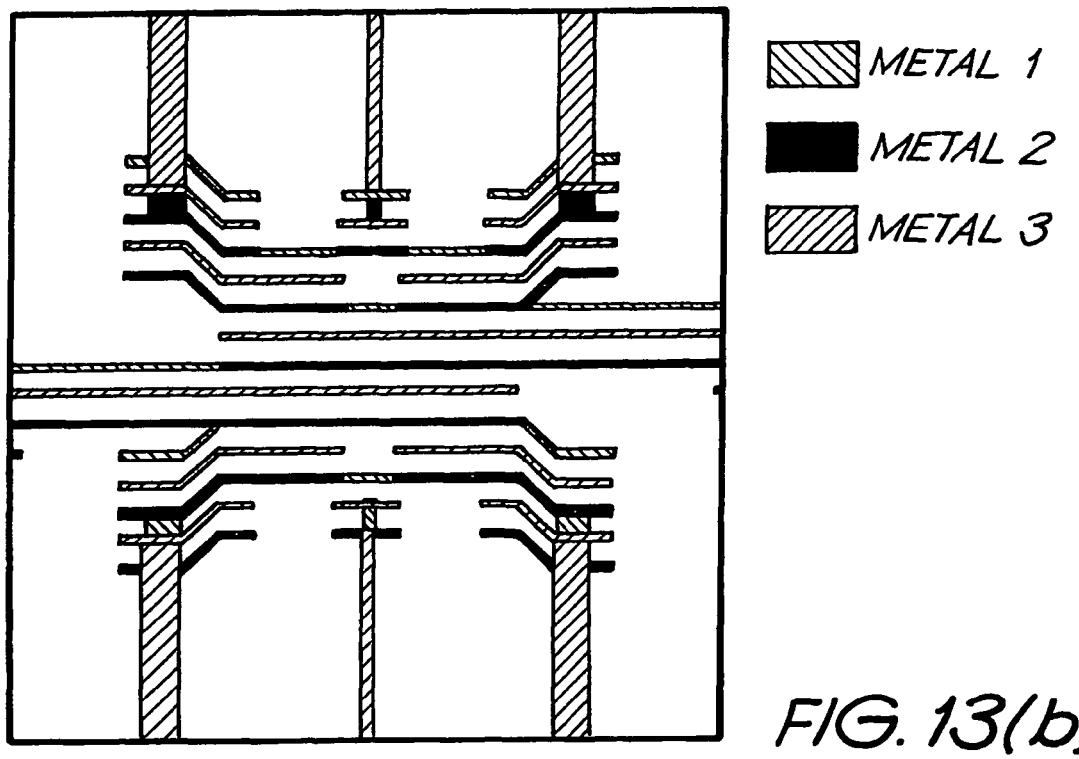

The process flow for this device is identical to that for the four and six-donor devices described above, with the exception that a different EBL pattern is used for the SETs and the control gates. This pattern is shown in FIG. 13(a). FIG. 13(b) is a schematic showing the resulting gate and SET array following a triple-angle evaporation through the EBL-defined mask of FIG. 13(a).

Figure 13D:
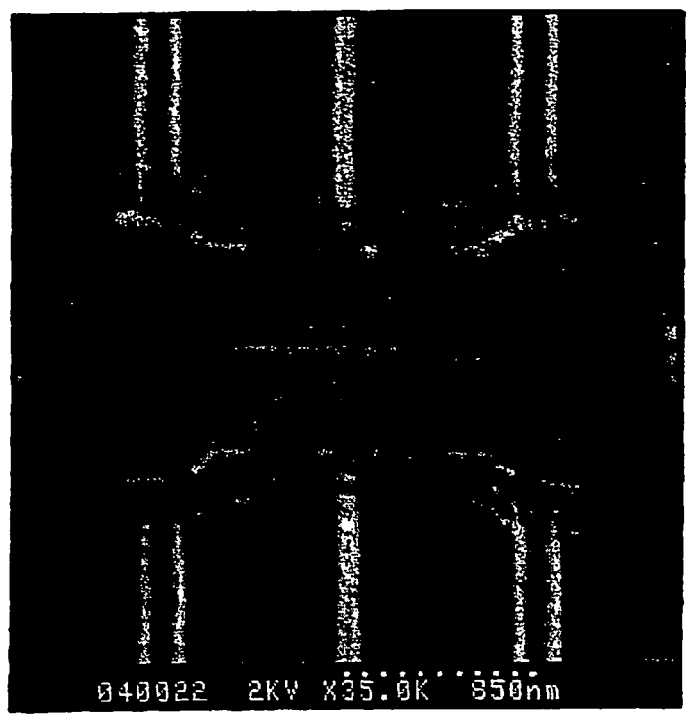
Figure 13C:
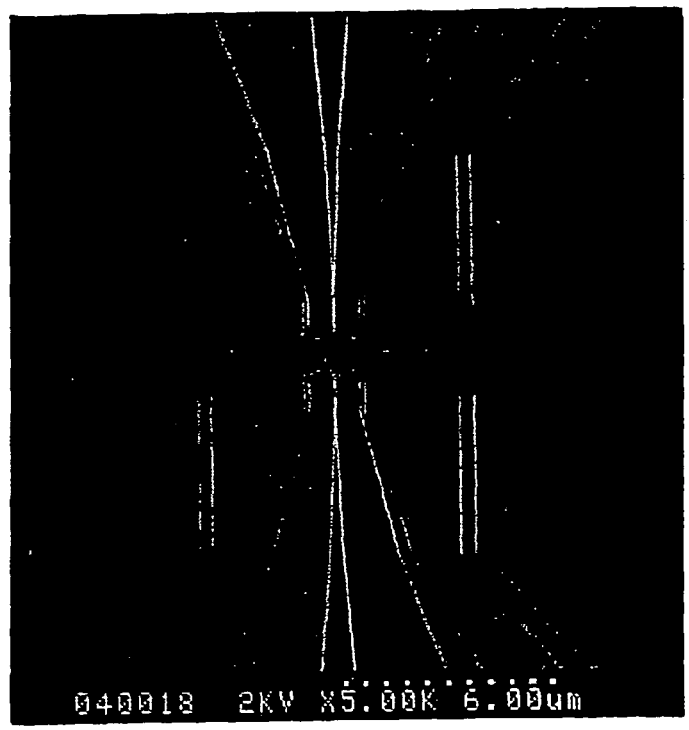

An experimental demonstration of the SET and A- and J-gate circuitry for this two-donor device is given in FIG. 13(c), which clearly shows the lead arrangements for external electrical connection. FIG. 13(d) shows a detailed view of the central region of the device. This circuitry was fabricated using the same steps described for the twin-SET device shown in FIG. 4, except that a triple-angle evaporation process was used, along with a different EBL pattern. Note that once ion implantation is carried out using this design, the device will be similar to the twin-SET read-out simulation device, except that there is now a J-gate located between the two donors. More importantly, the fully-configured device could be used to measure electron-spin and possibly nuclear-spin relaxation times.

(iii) Nanocircuits that may be Fabricated using the Technique—Read-Out in a SSQC The ability to detect the spin state of a single electron or nucleus is of great interest not only in its own right, but also because of its application to quantum computation. One approach to single spin detection is to directly detect the magnetic field, for example with a scanning magnetic resonance force microprobe[9]. An alternative approach is to detect a spin-dependent tunnelling event, and thereby deduce the electron spin[1]. A schematic arrangement of such an experiment, as proposed by Kane[1], is shown in FIG. 14, and it will be appreciated that such a structure can be fabricated using the technique described above.

The gate electrodes are used to create an electric field that encourages an electron to tunnel from one atom to the other. However, due to Pauli exclusion, this tunnelling is blocked if the two electrons are in the same spin state. On the other hand, if the two electron system is in a singlet state, with anti-parallel electron spins, tunnelling is permitted. Thus a measurement of the spin-dependent tunnelling can be used to determine the spin state of a qubit, as described by Kane[1]. This single electron tunnelling event can be detected by a highly sensitive electrometer, such as a single electron transistor. The conductance of an SET is extremely sensitive to the electrostatic landscape, and in principle the SET can detect the movement of a single electron from one donor atom to another.

In FIG. 16 we show an Al-based SET that has been fabricated using standard bilayer resist, electron-beam lithography and double-angle shadow evaporation[5,6]. The configuration of the SET is schematically depicted in FIG. 15. At low temperatures, the conductance (G) of the SET oscillates periodically as the voltage bias ($V_g$) on the plunger gate is increased (see FIG. 17), due to single electron charging. The data is highly reproducible, and also shows how the oscillations are washed out as the source-drain bias is increased. The period of the oscillations is given by $\Delta V_g = e/C_g$, where $C_g$ is the capacitance between the plunger gate and the island. From an analysis of this and other data we estimate that $C_g = 2.3$ aF, and the charging energy of the dot is 0.12 meV.

However the SET is sensitive to the motion of any charge in its vicinity, not just the spin dependent tunnelling process we wish to detect. This can be clearly seen in the data of FIG. 17, where a kink occurs in the data at $V_g = 129$ mV. This kink cannot be caused by a random tunnelling event, as it occurs in each of the traces in FIG. 17 at the same $V_g$. If we plot the plunger gate bias at which the conductivity maxima occur against the peak index, shown in FIG. 18, we see there is a sudden discontinuity at $V_g = 129$ mV, exactly where the kink in the raw data occurs. However the slope of the lines, and hence the period $\Delta V_g$ remains constant away from this discontinuity.

This discontinuity may be due to a trap in the silicon oxide layer changing its ionisation state, causing an abrupt change in the electrostatic potential felt by the SET. Although the gate voltage necessary to charge these traps will not be reproducible between devices, it can be seen that these charging events are reproducible in that they always occur at the same plunger gate voltage. Charging of traps such as observed here is likely to occur in a real SSQC, and it is therefore necessary to have a method to distinguish between spin-dependent tunnelling events in the SSQC, and the tunnelling of charge to/from trap states near the SET.

To enable this distinction to be made we have devised the architecture shown in FIG. 19. Here SETs are placed on either side of the two P-atoms in which the spin dependent tunnelling is to occur. This twin-SET design makes it possible to discriminate random events near one of the SETs from spin-dependent tunnelling events. A random charging event will affect both SETs in the same manner, although presumably the SET closest to the trap will be more strongly affected. However, as the electron tunnels from one P-atom to the other, it will affect the two SETs in equal but opposite senses: the left-hand SET will register the departure of the electron from the first P-atom, whereas the right hand SET will register the arrival of the electron at the second P-atom. Thus an anti-correlation measurement of the output of the two SETs will make it possible to reject almost all unwanted signals from the system due to random charge fluctuations.

The simplest measurement scenario is thus to gradually increase the differential bias across the two A-gates, and look for an anti-correlated output of the twin-SET as a signal of single electron tunnelling. Indeed this concept has already been demonstrated in the context of quantum-dot cellular automata, where a rectangular grid of four quantum dots is used to store information in the polarisation of the dots[7].

A further refinement of this technique is to superimpose an ac modulation on the dc bias applied to the A gates, which modulates the electric field which causes the electron tunnelling. Thus instead of trying to detect a single tunnelling event, we can lock in to the correlated twin-SET response at this frequency, and detect the polarisability of this artificial double atom molecule. If the electron spins are antiparallel, there is no Pauli exclusion between the two electron clouds, and the molecule is polarisable. However if the electron spins are aligned, the Pauli exclusion reduces the polarisability of this system. Thus an ac measurement of the polarisability of a double quantum dot system can be used to readout the electron spin states, while significantly reducing background noise by only measuring at the ac modulation frequency. Operating the SETs at radio-frequencies provides further reduction of unwanted noise, by moving away from low frequencies where 1/f noise dominates[10].

In order to test this measurement architecture, a device with two metal dots connected by a tunnel junction instead of two P atoms and without J-gates was designed, FIG. 20. This design is considerably more compact than the quantum dot cellular architecture of Ref. [7], and the arrangement of gates, Al islands and SETs is similar to the device that is required for single-spin detection in a SSQC. The devices were fabricated utilising the same techniques that are described above, producing devices such as that shown in FIG. 4.

For this test architecture the measurement proceeds along the following lines.

Figure 21A:
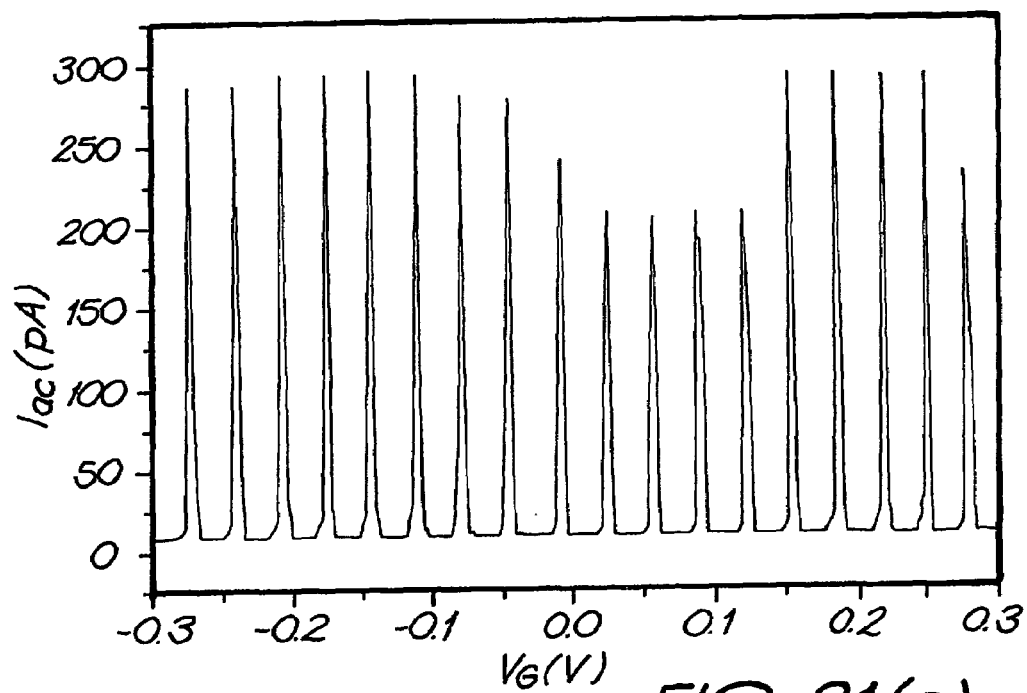
Figure 21B:
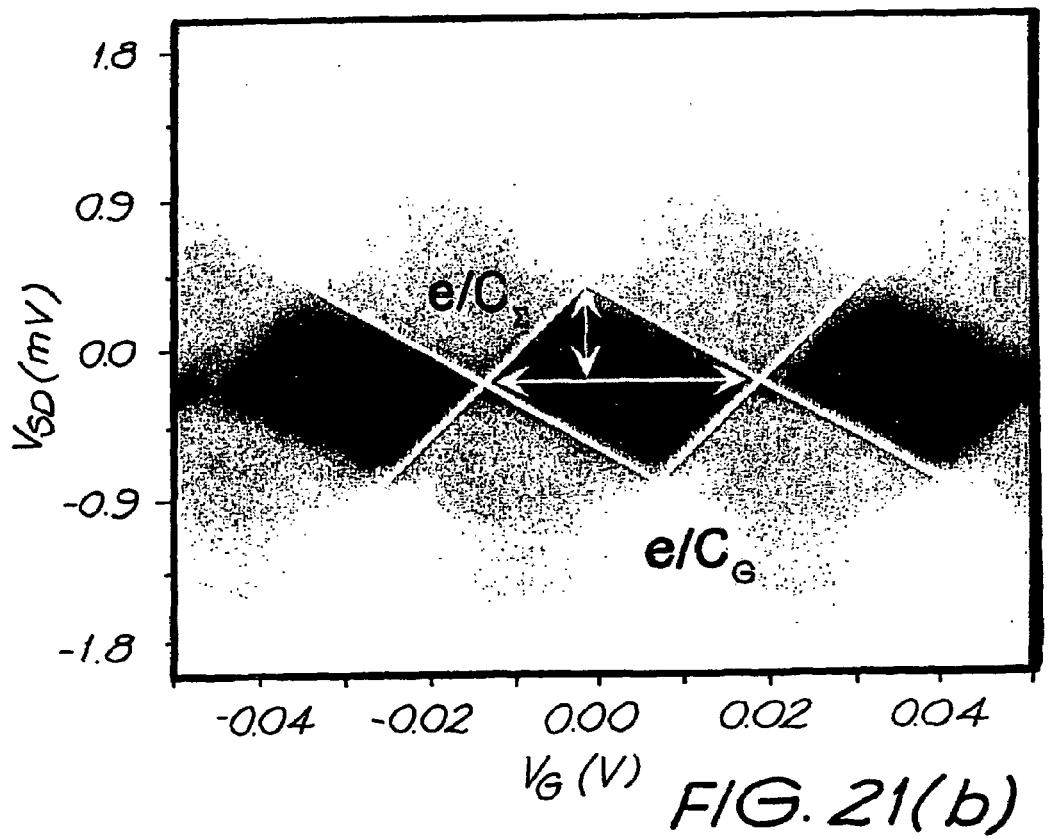

The conductance values of the two SETs are monitored separately with two independent measurement circuits. The plunger gate biases are then adjusted to position the two SETs at the most sensitive point in their G-$V_g$ characteristics, where $\delta G/\delta V_g$ is maximum. FIG. 21(a) shows the I-$V_g$ characteristic for one SET in a twin-SET device, and FIG. 21(b) shows a full characterisation of source-drain voltage as a function of $V_g$ for the same device, from which the dot charging energy can be determined.

The dc biases on the control A-gates are then gradually increased to cause an electron to tunnel from one of the central aluminium islands to the other. A small ac modulation at frequency f superimposed on this dc bias allows us to lock the outputs of the SET to this frequency, eliminating background noise. When the electric fields set up by the control A-gates are sufficiently large to allow an electron to tunnel, the conductances of the two SETs will simultaneously change in opposite senses, and an anti-correlation measurement can thus detect the single charge tunnelling. FIG. 22(a) is an SEM micrograph of a twin-SET device, highlighting gate A1. FIGS. 22(b) and (c) are data obtained on this device with experimental plots of the tunnel current measured as a function of voltage on gate A1, showing structure which appears to arise from the controlled transfer of single charges across the tunnel junction of the coupled metal dots, as expected.

Figure 23A:
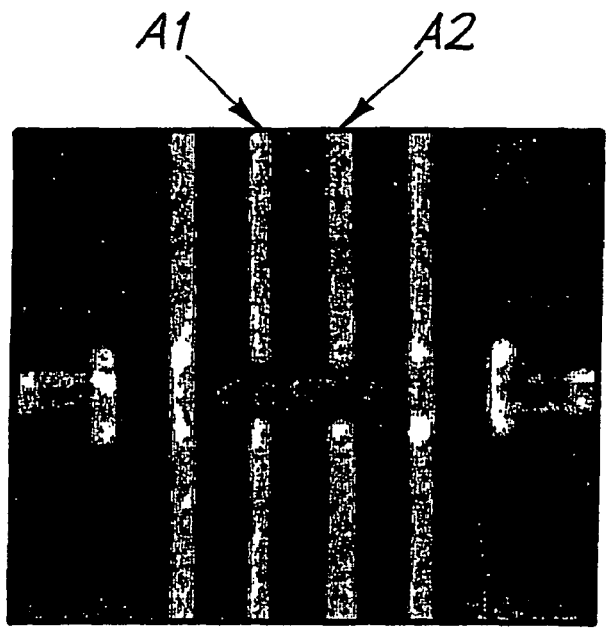
Figure 23B:
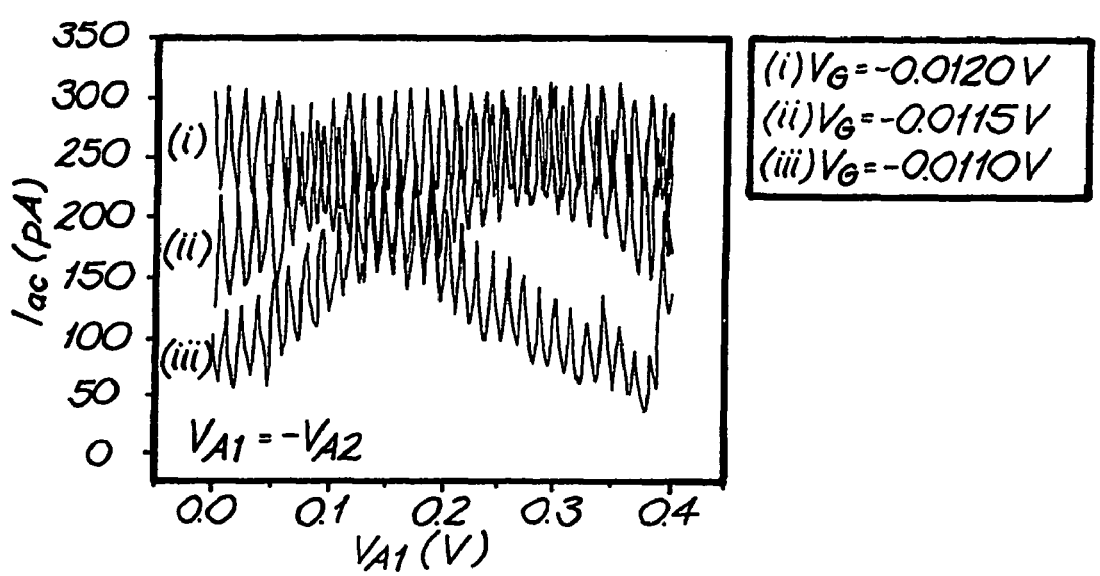

FIG. 23(a) is an SEM micrograph of a twin-SET device, highlighting gates A1 and A2. FIG. 23(b) is a graph of the tunnel current measured at three different plunger gate voltages as a function of voltage on gate A1 with an opposite voltage applied to gate A2 ($V_{A1}=-V_{A2}$) in order to introduce a field gradient across the double dot structure. By balancing $V_{A1}=-V_{A2}$, the average potential seen at the SET is held approximately constant, and was chosen to be at a level such that the average current $I_{ac}$ was approximately half the maximum peak level ($I_{max}$~300 pA). As $V_{A1}$ is varied, $V_{A2}$ compensates to ensure the current is held roughly constant. However, the varying $V_{A1}=-VA_{A2}$ will cause electron tunnelling events from one dot to another. These events are observed as oscillations in $I_{ac}$ in FIG. 23(b).

A further refinement to this measurement technique is to continuously adjust the two plunger gate voltages to keep the SETs at their most sensitive points in the G-$V_g$ characteristics. In this case, the measured output signal is the plunger gate voltage, in analogy with the error feedback signal in an STM measurement.

The references used in the text above are incorporated herein by reference:

[1] B. E. Kane, Nature 393, 13 (1998).
[2] B. E. Kane, Patent Application PCT/AU98/00777.
[3] R. Vrijen et al., Phys. Rev. A 62, 012306 (2000).
[4] B. E. Kane, Patent Application PCT/AU98/00778.
[5] G. J. Dolan, Appl. Phys. Lett. 31, 337 (1977).
[6] T. A. Fulton and G. J. Dolan, Phys. Rev. Lett. 59, 109 (1987).
[7] I. Amlani, A. O. Orlov, G. L. Snider and G. H. Bernstein, J. Vac. Sci. Technol. B 15, 2382 (1997).
[8] W. Chen and H. Ahmed, Appl. Phys. Lett. 62, 1499 (1993).
[9] P. C. Hammel, Z. Zhang, G. J. Moore and M. L. Roukes, J. Low Temp. Phys. 101, 59 (1995).
[10] R. J. Schoelkopf, P. Wahlgren, A. A. Kozhevnikov, P. Delsing, D. E. Prober, Science 280, 1238 (1998).

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

The invention claimed is:

1. A method for fabricating nanoelectric circuits, including the steps of:
   coating a semiconductor substrate surface with one or more layers of resist;
   exposing a first circuit pattern into the one or more layers of resist;
   exposing a second circuit pattern into the one or more layers of resist, after the first circuit pattern has been exposed into the one or more layers of resist, such that the second circuit pattern crosses the previously exposed pattern;
   developing the one or more layers of resist to open holes through the one or more layers of resist only where the patterns cross each other; and
   implanting an ion through each hole;
   the method including the further step of evaporating metal at different angles through the one or more layers of resist remaining to create active devices and conducting control gates on the semiconductor substrate surface positioned relative to the implanted ions as determined by the angle of evaporation.

2. A method for fabricating nanoelectric circuits, including the steps of:
   coating a semiconductor substrate surface with one or more layers of resist;
   exposing a first circuit pattern into the one or more layers of resist;
   exposing a second circuit pattern into the one or more layers of resist, after the first circuit pattern has been exposed into the one or more layers of resist, such that the second circuit pattern crosses the previously exposed pattern;

developing the one or more layers of resist to open holes through the one or more layers of resist only where the patterns cross each other; and implanting an ion through each hole;

where one circuit pattern defines the geometry of active devices and conducting control gates, and another circuit pattern defines the locus on which the holes are to be opened for the ion implantation.

3. A method for fabricating nanoelectric circuits, including the steps of:

coating a semiconductor substrate surface with one or more layers of resist;

exposing a first circuit pattern into the one or more layers of resist;

exposing a second circuit pattern into the one or more layers of resist, after the first circuit pattern has been exposed into the one or more layers of resist, such that the second circuit pattern crosses the previously exposed pattern;

developing the one or more layers of resist to open holes through the one or more layers of resist only where the patterns cross each other; and implanting an ion through each hole;

where both circuit patterns are written with the same resolution and accuracy as each other.

4. A method for fabricating nanoelectric circuits, including the steps of:

coating a semiconductor substrate surface with one or more layers of resist;

exposing a first circuit pattern into the one or more layers of resist;

exposing a second circuit pattern into the one or more layers of resist, after the first circuit pattern has been exposed into the one or more layers of resist, such that the second circuit pattern crosses the previously exposed pattern;

developing the one or more layers of resist to open holes through the one or more layers of resist only where the patterns cross each other; and implanting an ion through each hole;

the method utilizing a multi-layer resist through which one or more ions are implanted through each hole, and a multi-angle metal deposition being used to create the active devices and the control gates registered above the implanted ions, wherein the circuits are suitable for solid state quantum computer control and read-out.

5. A method for fabricating nanoelectric circuits, including the steps of:

coating a semiconductor substrate surface with one or more layers of resist;

exposing a first circuit pattern into the one or more layers of resist;

exposing a second circuit pattern into the one or more layers of resist, after the first circuit pattern has been exposed into the one or more layers of resist, such that the second circuit pattern crosses the previously exposed pattern;

developing the one or more layers of resist to open holes through the one or more layers of resist only where the patterns cross each other; and implanting an ion through each hole;

in which method a three-layer resist is used, and a double-angle or triple-angle metal deposition is used, wherein the circuits are suitable for solid state quantum computer control and read-out.

6. A method for fabricating nanoelectric circuits, comprising the steps of:

coating a semiconductor substrate with a layer of a first resist;

writing a first pattern for the locus of ion positions into the first resist;

developing the first resist into which has been written the first pattern;

coating the semiconductor substrate, over the first resist which has been developed, with a layer of a second resist and then with a layer of a third resist of sensitivity lower than sensitivity of the second resist where both the second and third resists use a different developer process compared to the developer process used for the first resist;

writing a second pattern for metal circuitry into the resist layers such that the second pattern crosses over the first pattern;

partially developing the resist layers, into which has been written the second pattern, such that trenches are opened in the second and third resists only where the second pattern is defined, and such that holes down to the silicon substrate are opened only where the first and second patterns cross each other; and implanting one or more ions through each hole;

the method utilizing a multi-layer resist through which one or more ions are implanted through each hole, and a multi-angle metal deposition being used to create the active devices and the control gates registered above the implanted ions.

7. A method according to claim 6, comprising the additional step of:

implanting single ions through each hole.

8. A method according to claim 7, comprising the additional step of:

fully developing the resist layers, into which has been written the second pattern, to create a cavity region under the third resist.

9. A method according to claim 8, comprising the additional step of:

removing the remainder of the first resist which lies within the cavity region.

10. A method according to claim 9, comprising the additional step of:

evaporating metal at a first angle through the resist layers.

11. A method according to claim 10, comprising the additional step of:

oxidising the surface of the deposited metal.

12. A method according to claim 11, comprising the additional step of:

evaporating metal at a second angle through the resist layers.

13. A method according to claim 12, comprising the additional step of:

evaporating metal at a third angle through the resist layers.

14. A method according to claim 13, comprising the additional step of:

lifting-off all resist layers in solvents to reveal a completed device.

15. A method according to claim 14, comprising the additional step of:

passivating or glassivating the surface as required.

16. A method according to claim 15, comprising the additional step of:

annealing the device to activate dopants and remove ion-beam damage.

17. A method for fabricating nanoelectric circuits comprising the steps of:

coating a semiconductor substrate with a layer of a first resist;

writing a first pattern for the locus of ion positions into the first resist;

developing the first resist into which has been written the first pattern;

coating the semiconductor substrate, over the first resist which has been developed, with a layer of a second resist and then with a layer of a third resist of sensitivity lower than sensitivity of the second resist, where both the second and third resists use a different developer process compared to the developer process used for the first resist;

writing a second pattern for metal circuitry into the resist layers such that the second pattern crosses over the first pattern;

partially developing the resist layers, into which has been written the second pattern, such that trenches are opened in the second and third resist only where the second pattern is defined, and such that holes down to the silicon substrate are opened only where the first and second patterns cross each other; and implanting one or more ions through each hole;

the method of utilizing a multi-layer resist through which one or more ions are implanted through each hole, and a multi-angle metal deposition being used to create the active devices and the control gates registered above the implanted ions.

18. A method according to claim 1, comprising the additional step of:

evaporating metal at a first angle through the resist layers.

19. A method according to claim 2, comprising the additional step of:

oxidising the surface of the deposited metal.

20. A method according to claim 3, comprising the additional step of:

evaporating metal at a second angle through the resist layers.

21. A method according to claim 1, where part of the circuit pattern for the active devices and conducting control gates is a series of parallel straight lines and the other pattern is a straight line transverse to the straight lines of the circuit pattern for the active devices and conducting control gates.

22. A method according to claim 2, where part of the circuit pattern for the active devices and conducting control gates is a series of parallel straight lines and the other pattern is a straight line transverse to the straight lines of the circuit pattern for the active devices and conducting control gates.

23. A method according to claim 3, where part of the circuit pattern for the active devices and conducting control gates is a series of parallel straight lines and the other pattern is a straight line transverse to the straight lines of the circuit pattern for the active devices and conducting control gates.

* * * * *